United States Patent
Yoshida

(10) Patent No.: US 12,446,281 B2
(45) Date of Patent: Oct. 14, 2025

(54) NITRIDE SEMICONDUCTOR SUBSTRATE MANUFACTURING METHOD, AND LAMINATED STRUCTURE

(71) Applicant: SUMITOMO CHEMICAL COMPANY, LIMITED, Tokyo (JP)

(72) Inventor: Takehiro Yoshida, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 870 days.

(21) Appl. No.: 17/292,192

(22) PCT Filed: Nov. 8, 2019

(86) PCT No.: PCT/JP2019/043879
§ 371 (c)(1),
(2) Date: May 7, 2021

(87) PCT Pub. No.: WO2020/096045
PCT Pub. Date: May 14, 2020

(65) Prior Publication Data
US 2021/0391427 A1    Dec. 16, 2021

(30) Foreign Application Priority Data
Nov. 8, 2018 (JP) .................. 2018-210536

(51) Int. Cl.
*C30B 15/20*    (2006.01)
*C30B 29/38*    (2006.01)
(Continued)

(52) U.S. Cl.
CPC ......... *H10D 62/8503* (2025.01); *C30B 29/38* (2013.01); *H01L 21/022* (2013.01);
(Continued)

(58) Field of Classification Search
CPC ....... C30B 25/186; C30B 25/20; C30B 29/38; C30B 29/406; C30B 29/68;
(Continued)

(56) References Cited

U.S. PATENT DOCUMENTS 6,468,347 B1    10/2002  Motoki et al.
2005/0073027 A1*  4/2005  Irikura ................ H01L 21/0254
                                                    257/E21.119
(Continued)

FOREIGN PATENT DOCUMENTS

CN    101009350 A    8/2007
CN    108028299 A    5/2018
(Continued)

OTHER PUBLICATIONS

International Searching Authority, "International Search Report," issued in connection with International Patent Application No. PCT/JP2019/043879, dated Feb. 4, 2020.
(Continued)

*Primary Examiner* — Hua Qi
(74) *Attorney, Agent, or Firm* — Foley & Lardner LLP

(57) ABSTRACT

A method for manufacturing a nitride semiconductor substrate by using a vapor phase growth method, including: a step of preparing a base substrate of a single crystal of a group III nitride semiconductor and in which a low index crystal plane closest to a main surface is a (0001) plane; an etching step of the base substrate to roughen the main surface; a first step of growing a first layer by epitaxially growing a single crystal of a group III nitride semiconductor on the main surface, and at least some of the plurality of recessed portions being gradually expanded toward an upper side of the main surface of the base substrate, the first layer including a first surface from which the (0001) plane has disappeared and that is constituted only by the inclined
(Continued)

interfaces; and a second step of growing a second layer including a mirror second surface.

11 Claims, 15 Drawing Sheets

(51) Int. Cl.
  *H01L 21/02* (2006.01)
  *H01L 21/304* (2006.01)
  *H10D 62/85* (2025.01)
(52) U.S. Cl.
  CPC .. *H01L 21/02263* (2013.01); *H01L 21/02293* (2013.01); *H01L 21/02389* (2013.01); *H01L 21/304* (2013.01)
(58) Field of Classification Search
  CPC ............. H01L 21/02005; H01L 21/022; H01L 21/02263; H01L 21/02293; H01L 21/02389; H01L 21/0243; H01L 21/02433; H01L 21/02458; H01L 21/0254; H01L 21/0262; H01L 21/02658; H01L 21/304; H01L 29/045; H01L 29/2003
  See application file for complete search history.

(56) References Cited

U.S. PATENT DOCUMENTS

| | | | |
|---|---|---|---|
| 2005/0076828 A1 | 4/2005 | Taki et al. | |
| 2007/0176199 A1 | 8/2007 | Shibata | |
| 2010/0275836 A1* | 11/2010 | Sato | C30B 29/406 117/97 |
| 2012/0119236 A1* | 5/2012 | Yu | H10H 20/85 257/E33.056 |
| 2013/0001644 A1* | 1/2013 | Fujikura | H10D 8/60 257/190 |
| 2013/0072005 A1 | 3/2013 | Fujikura | |
| 2014/0147650 A1* | 5/2014 | Jiang | C30B 29/403 428/220 |
| 2018/0254380 A1 | 9/2018 | Muroo et al. | |

FOREIGN PATENT DOCUMENTS

| | | |
|---|---|---|
| JP | 2001-102307 A | 4/2001 |
| JP | 2005-072310 A | 3/2005 |
| JP | 2009-167053 A | 7/2009 |
| JP | 2013-060349 A | 4/2013 |
| JP | 2013-209270 A | 10/2013 |
| JP | 2013-214686 A | 10/2013 |

OTHER PUBLICATIONS

International Searching Authority, "Written Opinion," issued in connection with International Patent Application No. PCT/JP2019/043879, dated Feb. 4, 2020.

International Preliminary Report on Patentability from PCT/JP2019/043879 Dtd May 20, 2021 (7 pages).

* cited by examiner

S100 Base substrate preparation step
S190 Etching step
S220 Recessed portion expansion step
S200 First step
S240 Inclined interface maintenance step
S320 c-plane expansion step
S300 Second step
S340 Main growth step
S400 Slicing step
S500 Polishing step Fig.3
(a)
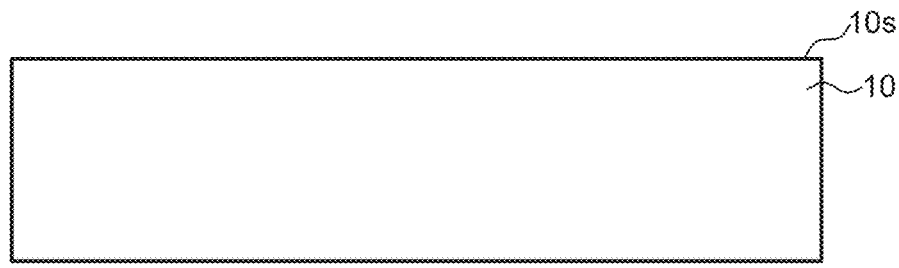
(b)
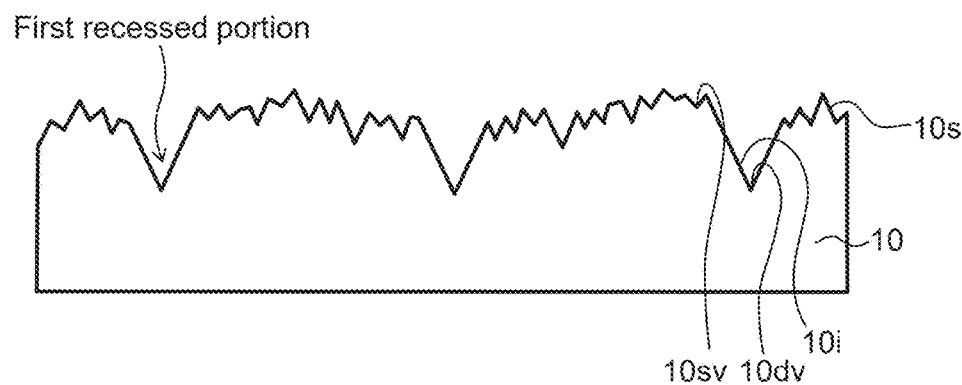
(c)
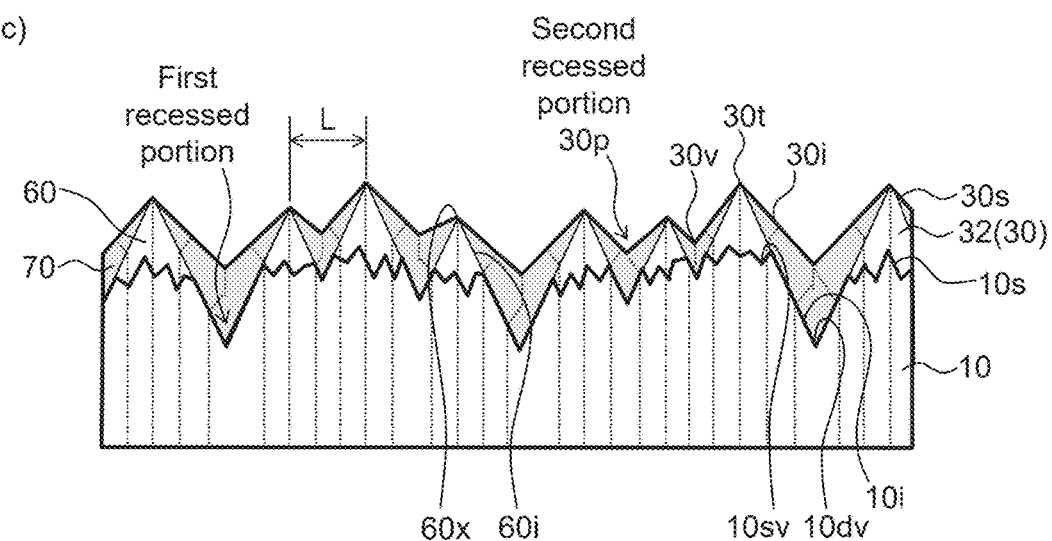

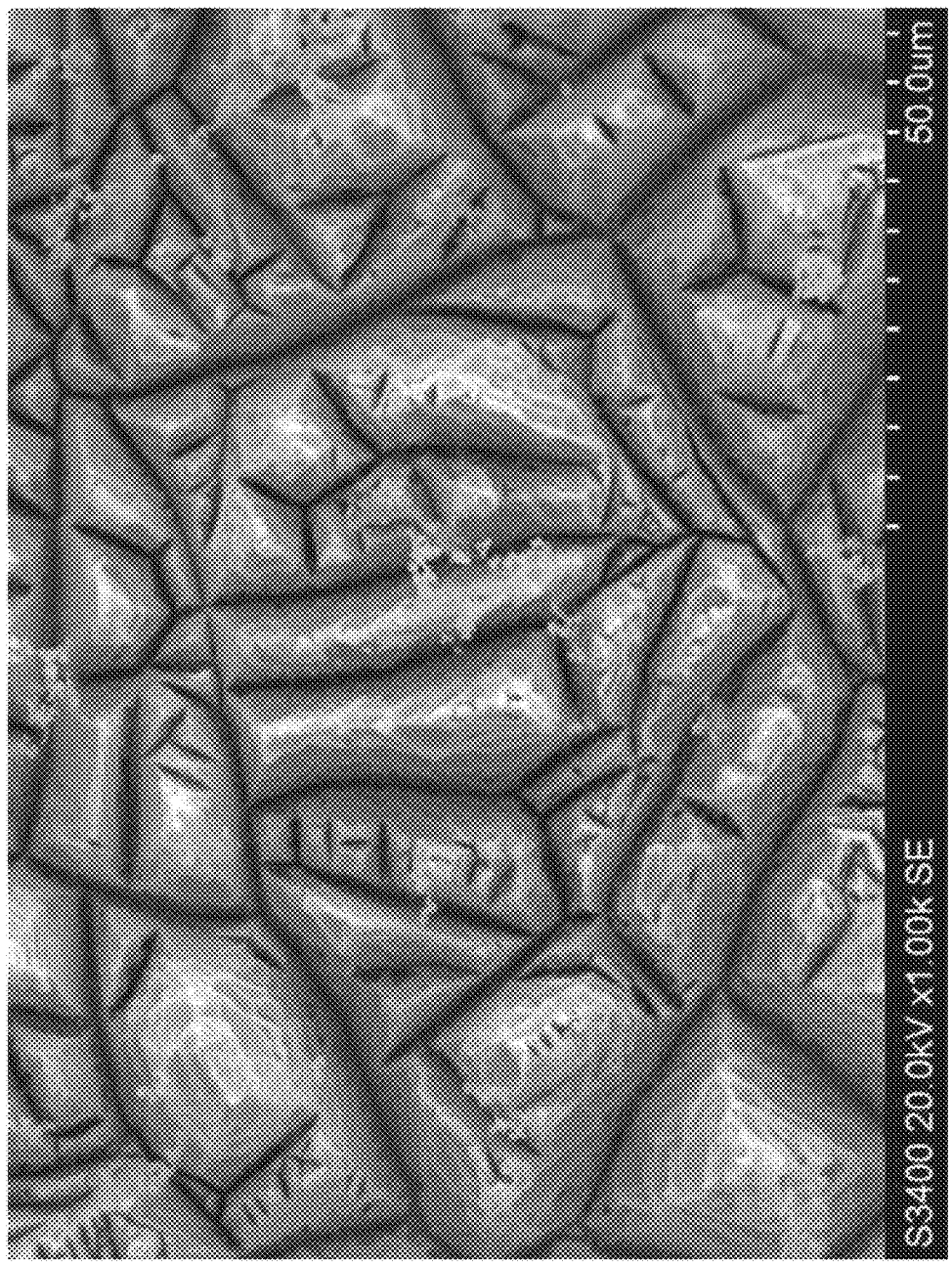
FIG.10A  Sample 1 : After etching

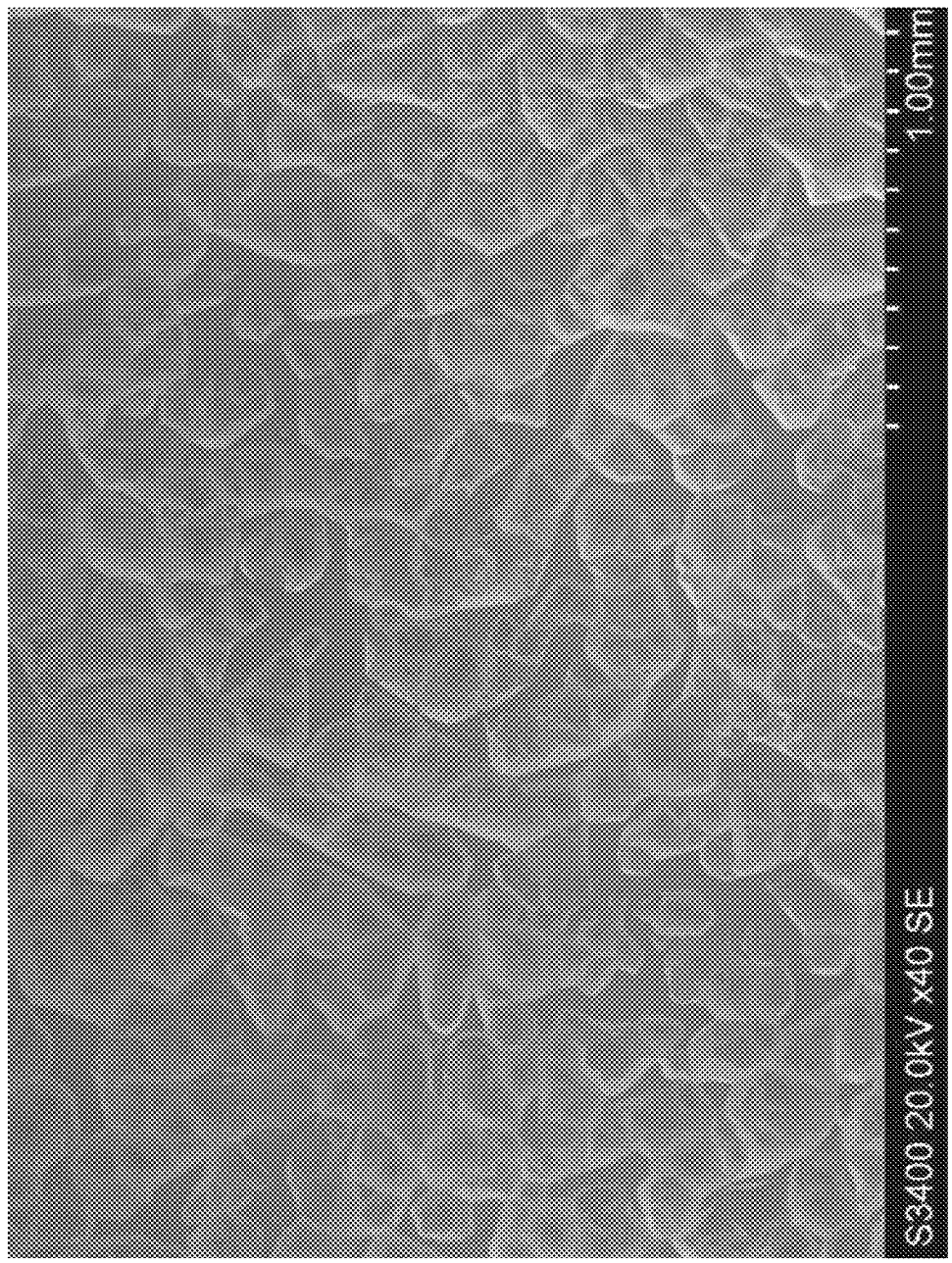
FIG.10B  Sample 2 : First layer 1.2mm

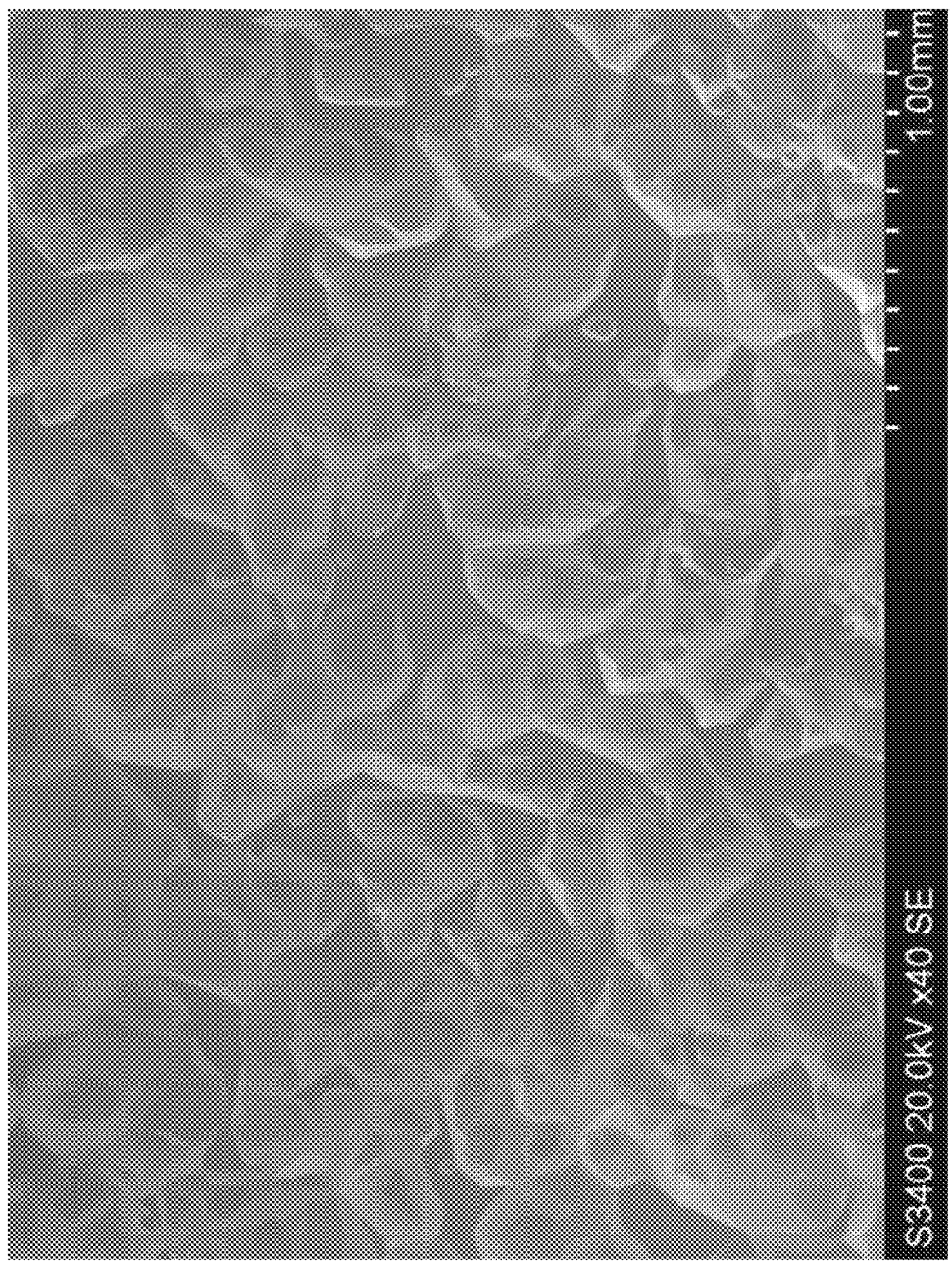
FIG.10C  Sample 3 : First layer 2.4mm ll# NITRIDE SEMICONDUCTOR SUBSTRATE MANUFACTURING METHOD, AND LAMINATED STRUCTURE

CROSS-REFERENCE TO RELATED APPLICATIONS

The present application claims priority under 37 U.S.C. § 371 to International Patent Application No. PCT/JP2019/043879, filed Nov. 8, 2019, which claims priority to and the benefit of Japanese Patent Application No. 2018-210536, filed on Nov. 8, 2018. The contents of these applications are hereby incorporated by reference in their entireties.

TECHNICAL FIELD

The present disclosure relates to a method for manufacturing a nitride semiconductor substrate, and a laminated structure.

BACKGROUND ART

In a conventionally known technique, a substrate that is constituted by a single crystal of a group III nitride semiconductor is used as a base substrate (seed substrate), and a crystal layer that is constituted by a single crystal of a group III nitride semiconductor is further grown on a main surface of the base substrate for which the closest low index crystal plane is a (0001) plane. According to this technique, at least one nitride semiconductor substrate can be obtained by slicing the crystal layer grown to a predetermined thickness (for example, Patent Document 1).

CITATION LIST

Patent Documents

Patent Document 1: Japanese Patent Application Laid-Open Publication No. 2013-60349

SUMMARY OF INVENTION

Technical Problem

An object of the present disclosure is to improve crystal quality of a nitride semiconductor substrate.

Solution to Problem

According to an aspect of the present disclosure, provided is a method for manufacturing a nitride semiconductor substrate by using a vapor phase growth method, including:
a step of preparing a base substrate that is constituted by a single crystal of a group III nitride semiconductor and in which a low index crystal plane closest to a main surface is a (0001) plane;
an etching step of etching the main surface of the base substrate to roughen the main surface;
a first step of growing a first layer by epitaxially growing a single crystal of a group III nitride semiconductor on the main surface of the base substrate, a plurality of recessed portions formed by inclined interfaces other than the (0001) plane being generated in a surface of the single crystal due to the roughened main surface of the base substrate, and at least some of the plurality of recessed portions being gradually expanded toward an upper side of the main surface of the base substrate, the first layer including a first surface from which the (0001) plane has disappeared and that is constituted only by the inclined interfaces; and
a second step of growing a second layer including a mirror-finished second surface by epitaxially growing a single crystal of a group III nitride semiconductor on the first layer so as to make the inclined interfaces disappear.

According to another aspect of the present disclosure, provided is a laminated structure including:
a base substrate that is constituted by a single crystal of a group III nitride semiconductor, has a roughened main surface, and in which a low index crystal plane that is closest to an imaginary plane obtained by averaging the main surface is a (0001) plane;
a first low oxygen concentration region that is provided on the main surface of the base substrate and is constituted by a single crystal of a group III nitride semiconductor;
a high oxygen concentration region that is provided on the first low oxygen concentration region and is constituted by a single crystal of a group III nitride semiconductor; and
a second low oxygen concentration region that is provided on the high oxygen concentration region and is constituted by a single crystal of a group III nitride semiconductor,
wherein an oxygen concentration in the high oxygen concentration region is higher than an oxygen concentration in the first low oxygen concentration region and an oxygen concentration in the second low oxygen concentration region, and
when an arbitrary cross section that is perpendicular to the main surface is observed,
an upper surface of the first low oxygen concentration region includes a plurality of valleys and a plurality of mountains, and
an average distance between a pair of mountains spaced apart from each other in a direction extending along the main surface is greater than 100 μm, the pair of mountains being closest to each other among the plurality of mountains with one of the plurality of valleys sandwiched therebetween.

Advantageous Effects of Invention

According to the present disclosure, crystal quality of a nitride semiconductor substrate can be improved.

BRIEF DESCRIPTION OF DRAWINGS

FIGS. 3(a) to 3(c) are schematic cross-sectional views illustrating a part of the method for manufacturing a nitride semiconductor substrate according to the embodiment of the present disclosure.

FIG. 10(a) is a diagram showing an observation image obtained by observing a surface of sample 1 of Experiment 1 using a scanning electron microscope, FIG. 10(b) is a diagram showing an observation image obtained by observing a surface of sample 2 of Experiment 1 using the scanning electron microscope, and FIG. 10(c) is a diagram showing an observation image obtained by observing a surface of sample 3 of Experiment 1 using the scanning electron microscope.

DESCRIPTION OF EMBODIMENTS

<Finding Obtained by Inventor>

Figure 1:
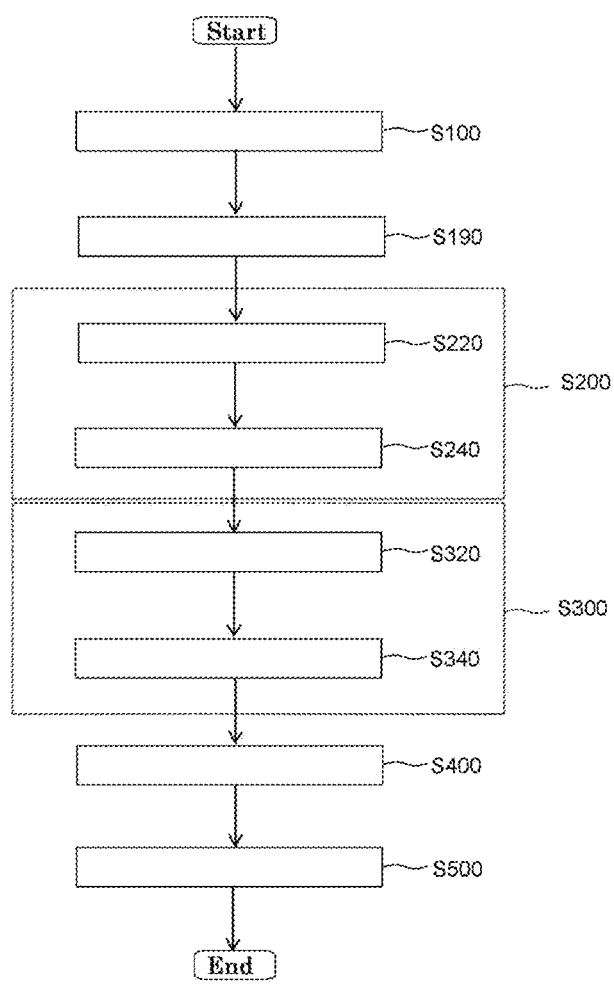
FIG. 1 is a flowchart illustrating a method for manufacturing a nitride semiconductor substrate according to an embodiment of the present disclosure.

First, findings obtained by the inventor will be described.

(i) Dislocation Density

Conventionally, when a crystal layer is further epitaxially grown on a base substrate constituted by a single crystal of a group III nitride semiconductor as described above, for example, the crystal layer on the base substrate is grown with only a c-plane as a growth surface without exposing inclined interfaces other than the c-plane. In this case, the dislocation density in a surface of the crystal layer tended to be inversely proportional to the thickness of the crystal layer.

However, when the crystal layer is grown with only the c-plane as the growth surface, the dislocation density in the surface of the crystal layer cannot be sufficiently lowered unless the crystal layer is grown very thick. This causes a reduction in productivity for obtaining a nitride semiconductor substrate having a desired dislocation density in the main surface.

Accordingly, a technique that makes it possible to efficiently obtain a nitride semiconductor substrate having a low dislocation density has been desired.

(ii) Variation in Off-Angle

In a nitride semiconductor substrate, a (0001) plane may be curved in a concave spherical shape with respect to the main surface. When the (0001) plane is curved with respect to the main surface, an off-angle varies within the main surface, the off-angle being an angle formed by <0001> axis with respect to a normal of the main surface.

The off-angle in the nitride semiconductor substrate affects, for example, a surface morphology of a semiconductor functional layer grown on the substrate. For example, when a radius of curvature of the (0001) plane of the substrate is small and a variation in the off-angle of the substrate is large, the surface morphology of the semiconductor functional layer may deteriorate in a portion on the substrate, due to the off-angle. Therefore, when a semiconductor device is manufactured as a Schottky barrier diode (SBD) using this substrate, a withstand voltage and reliability may decrease in the semiconductor device that is cut out from the portion where the surface morphology of the semiconductor functional layer has deteriorated.

Further, for example, when indium (In) is doped on the substrate to form a light emitting layer, the off-angle in the nitride semiconductor substrate affects the In content in the light emitting layer. For example, when the radius of curvature of the (0001) plane of the substrate is small and the variation in the off-angle of the substrate is large, the In content in the light emitting layer varies depending on the variation in the off-angle of the substrate. Therefore, there is a possibility that a light emission wavelength will vary or light emission will be uneven in a light emitting element that includes the light emitting layer.

Accordingly, a technique capable of reducing the variation in the off-angle in the nitride semiconductor substrate has been desired, to prevent practical problems such as deterioration of the surface morphology and uneven light emission.

The present disclosure is based on the findings of the above (i) and (ii) found by the inventor of the present disclosure.

Embodiment of the Present Disclosure

Hereinafter, an embodiment of the present disclosure will be described with reference to the drawings.

(1) Method for Manufacturing a Nitride Semiconductor Substrate

A method for manufacturing a nitride semiconductor substrate according to the present embodiment will be described with reference to FIGS. 1 to 5.

FIG. 1 is a flowchart illustrating the method for manufacturing a nitride semiconductor substrate according to the present embodiment. FIGS. 2(a) to 2(g), FIGS. 3(a) to 3(c), and FIGS. 4(a) to 5(b) are schematic sectional views illustrating a part of the method for manufacturing a nitride semiconductor substrate according to the present embodiment. Further, a thin solid line indicates a crystal plane in a process of growth in FIG. 4(b), and dotted lines indicate dislocations in FIGS. 3(c) and 4(a) to 5(b).

As illustrated in FIG. 1, the method for manufacturing a nitride semiconductor substrate according to the present embodiment includes: for example, a base substrate preparation step S100, an etching step S190, a first step S200, a second step S300, a slicing step S400, and a polishing step S500.

S100: Base Substrate Preparation Step

First, in the base substrate preparation step S100, a base substrate 10 that is constituted by a single crystal of a group III nitride semiconductor is prepared. In the present embodiment, for example, a gallium nitride (GaN) free-standing substrate is prepared as the base substrate 10.

Hereinafter, in a crystal of a group III nitride semiconductor having a wurtzite structure, <0001> axis (for example, [0001] axis) is referred to as a "c-axis", and (0001) plane is referred to as a "c-plane". The (0001) plane may be referred to as a "+c plane (group III element polar plane)", and the (000-1) plane may be referred to as a "-c plane (nitrogen (N) polar plane)". Further, <1-100> axis (for example, [1-100] axis) is referred to as an "m-axis", and {1-100} plane is referred to as an "m-plane". The m-axis may be expressed as <10-10> axis. Further, <11-20> axis (for example, [11-20] axis) is referred to as an "a-axis", and {11-20} plane is referred to as an "a-plane".

In the base substrate preparation step S100 of the present embodiment, for example, the base substrate 10 is prepared according to a VAS (Void-Assisted Separation) method.

Specifically, the base substrate preparation step S100 includes, for example, a crystal growth substrate preparation step S110, a first crystal layer forming step S120, a metal layer forming step S130, a void forming step S140, a second crystal layer forming step S150, a peeling step S160, a slicing step S170, and a polishing step S180.

S110: Crystal Growth Substrate Preparation Step

Figure 2:
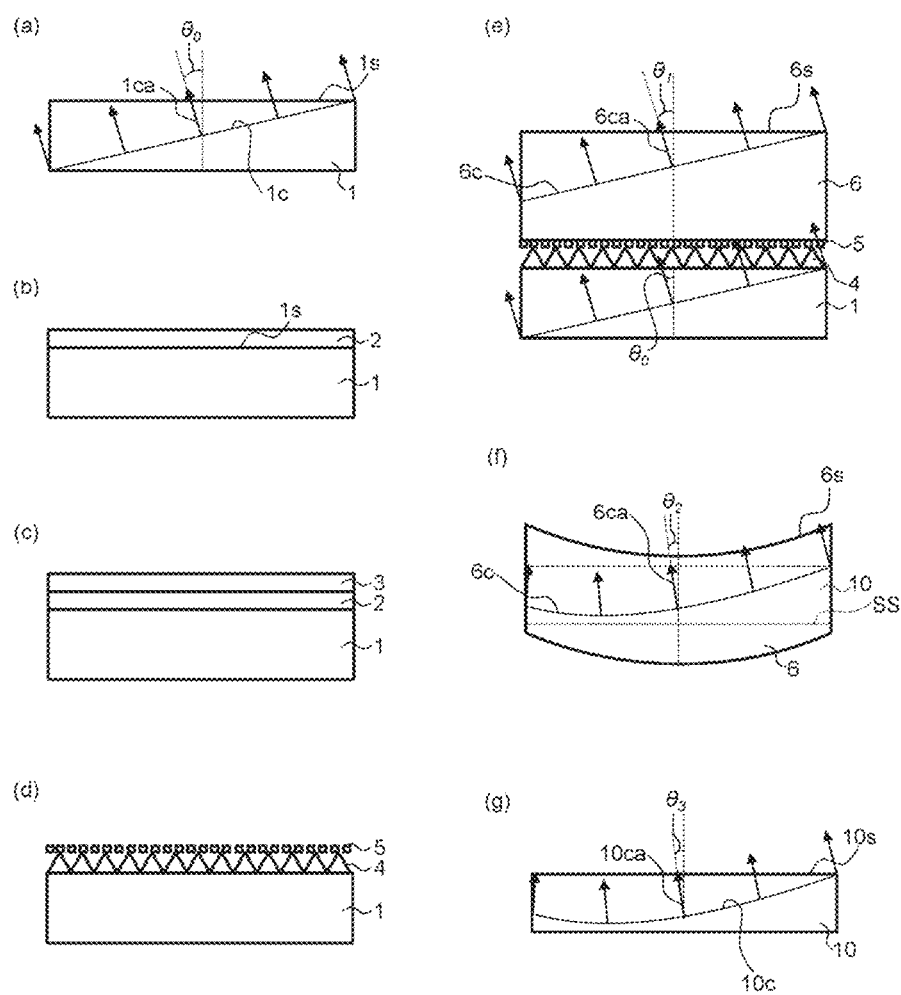
FIGS. 2(a) to 2(g) are schematic cross-sectional views illustrating a part of the method for manufacturing a nitride semiconductor substrate according to the embodiment of the present disclosure.
Figure 4:
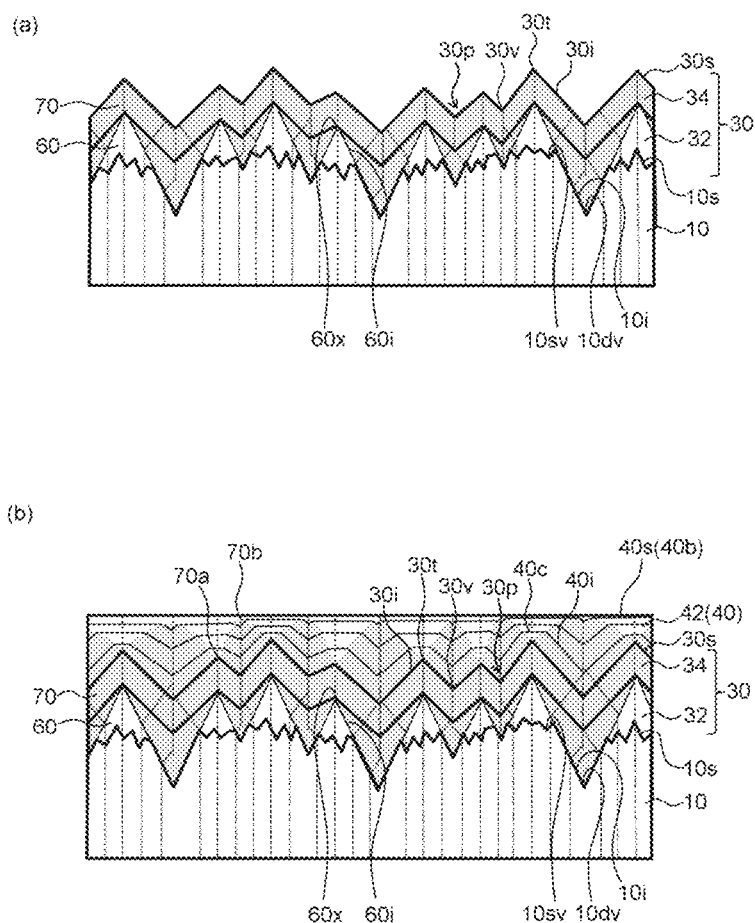
FIGS. 4(a) to 4(b) are schematic cross-sectional views illustrating a part of the method for manufacturing a nitride semiconductor substrate according to the embodiment of the present disclosure.
Figure 5:
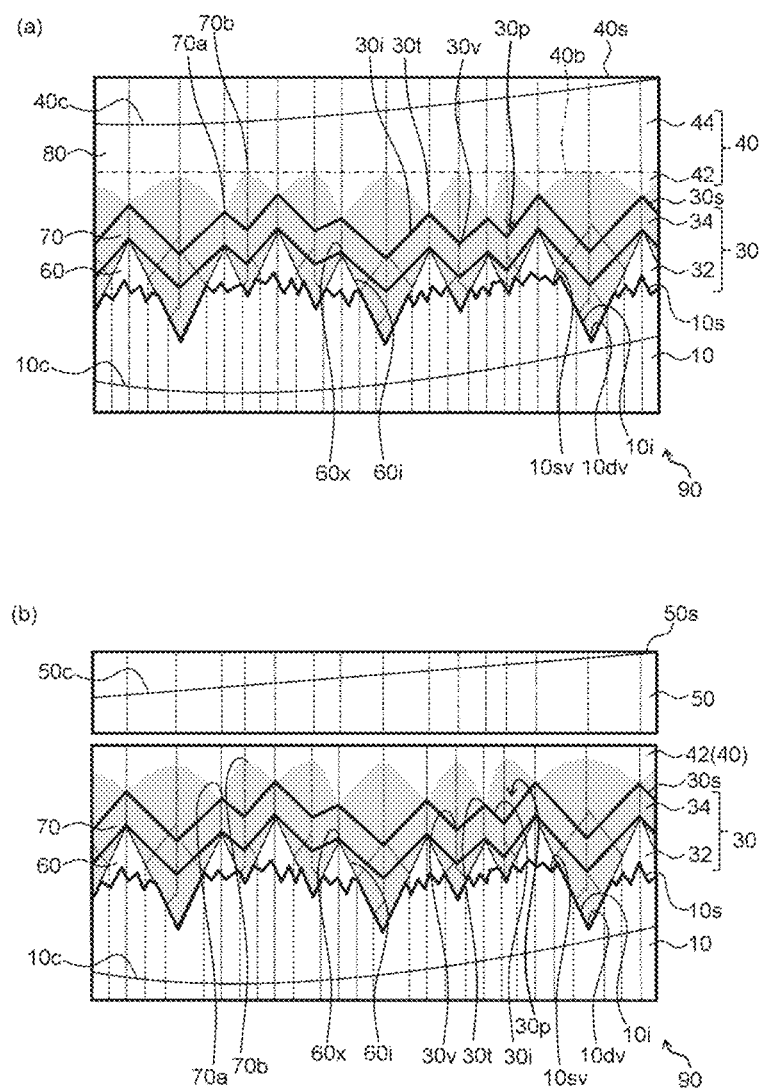
FIGS. 5(a) to 5(b) are schematic cross-sectional views illustrating a part of the method for manufacturing a nitride semiconductor substrate according to the embodiment of the present disclosure.

First, as illustrated in FIG. 2(*a*), a crystal growth substrate 1 (hereinafter may be abbreviated as a "substrate 1") is prepared. The substrate 1 is, for example, a sapphire substrate. Also, the substrate 1 may be, for example, a Si substrate or a gallium arsenide (GaAs) substrate. The substrate 1 has, for example, a main surface is which is a growth surface. A low index crystal plane that is closest to the main surface 1*s* is, for example, a c-plane 1*c*.

In the present embodiment, the c-plane 1*c* of the substrate 1 is inclined with respect to the main surface 1*s*. A c-axis Ica of the substrate 1 is inclined at a predetermined off-angle $\theta_0$ with respect to a normal of the main surface 1*s*. The off-angle $\theta_0$ in the main surface is of the substrate 1 is uniform over the entire main surface 1*s*. The off-angle $\theta_0$ in the main surface is of the substrate 1 affects an off-angle $\theta_3$ at the center of a main surface 10*s* of the base substrate 10, which will be described later.

S120: First Crystal Layer Forming Step

Next, as illustrated in FIG. 2(*b*), for example, a low-temperature growth GaN buffer layer and a Si-doped GaN layer are grown in this order as a first crystal layer (underground growth layer) 2 on the main surface is of the substrate 1, by supplying trimethylgallium (TMG) gas as a group III source gas, ammonia gas ($NH_3$) as a nitrogen source gas, and monosilane ($SiH_4$) gas as an n-type dopant gas, to the substrate 1 that is heated to a predetermined growth temperature, by a metalorganic vapor phase growth (MOVPE) method. At this time, the thickness of the low-temperature growth GaN buffer layer and the thickness of the Si-doped GaN layer are, for example, 20 nm and 0.5 µm, respectively.

S130: Metal Layer Forming Step

Next, as illustrated in FIG. 2(*c*), a metal layer 3 is deposited on the first crystal layer 2. The metal layer 3 is, for example, a titanium (Ti) layer. Further, the thickness of the metal layer 3 is, for example, 20 nm.

S140: Void Forming Step

Next, the above-described substrate 1 is put into an electric furnace, and the substrate 1 is placed on a susceptor having a predetermined heater. After the substrate 1 is placed on the susceptor, the substrate 1 is heated by the heater and heat treatment is performed thereto in an atmosphere containing hydrogen gas or hydride gas. Specifically, for example, the heat treatment is performed at a predetermined temperature for 20 minutes in a hydrogen ($H_2$) gas stream containing 20% $NH_3$ gas.

The heat treatment temperature is, for example, 850° C. or higher and 1,100° C. or lower. By performing such a heat treatment, the metal layer 3 is nitrided to form a metal nitride layer 5 having high-density fine holes on the surface. Further, by performing the above-described heat treatment, a part of the first crystal layer 2 is etched through the holes of the metal nitride layer 5 to form high-density voids in the first crystal layer 2.

Thereby, as illustrated in FIG. 2(*d*), a void-containing first crystal layer 4 is formed.

S150: Second Crystal Layer Forming Step

Next, for example, a Si-doped GaN layer is epitaxially grown as a second crystal layer (main growth layer) 6 over the void-containing first crystal layer 4 and the metal nitride layer 5 by supplying gallium chloride (GaCl) gas, $NH_3$ gas, and dichlorosilane ($SiH_2Cl_2$) gas as an n-type dopant gas, to the substrate 1 that is heated to a predetermined growth temperature by a hydride vapor deposition (HYPE) method. A Ge-doped GaN layer may be epitaxially grown as the second crystal layer 6 by supplying tetrachlorogermane ($GeCl_4$) gas or the like instead of $SiH_2Cl_2$ gas, as an n-type dopant gas.

At this time, the second crystal layer 6 grows from the void-containing first crystal layer 4 over the void-containing first crystal layer 4 and the metal nitride layer 5 through the holes in the metal nitride layer 5. Some of the voids in the void-containing first crystal layer 4 are filled with the second crystal layer 6, but the other voids in the void-containing first crystal layer 4 remain. A flat gap is formed between the second crystal layer 6 and the metal nitride layer 5 due to the voids remaining in the void-containing first crystal layer 4. This gap causes peeling of the second crystal layer 6 in a peeling step S160 described later.

Further, at this time, the second crystal layer 6 is grown by inheriting an orientation of the substrate 1. That is, an off-angle $\theta_1$ in the main surface of the second crystal layer 6 is uniform over the entire main surface, similarly to the off-angle $\theta_0$ in the main surface is of the substrate 1.

Further, at this time, the thickness of the second crystal layer 6 is, for example, 600 µm or more, preferably 1 mm or more. An upper limit of the thickness of the second crystal layer 6 is not particularly limited, but is preferably 50 mm or less from the standpoint of improving productivity.

S160: Peeling Step

After the growth of the second crystal layer 6 is complete, the second crystal layer 6 naturally peels off from the substrate 1 by separating from the void-containing first crystal layer 4 and the metal nitride layer 5 in a process of cooling a HYPE apparatus used to grow the second crystal layer 6.

At this time, tensile stress is introduced into the second crystal layer 6 as a result of initial nuclei, which are generated in the growth process, attracting each other. Therefore, due to the tensile stress generated in the second crystal layer 6, an internal stress acts on the second crystal layer 6 such that a front surface side thereof becomes concave. Further, a dislocation density in the main surface (front surface) side of the second crystal layer 6 is low, while a dislocation density in a back surface side of the second crystal layer 6 is high. Therefore, due to the difference in the dislocation density in a thickness direction of the second crystal layer 6 as well, an internal stress acts on the second crystal layer 6 such that the front surface side thereof becomes concave.

As a result, as illustrated in FIG. 2(f), after the second crystal layer 6 is peeled off from the substrate 1, the front surface side thereof is warped so as to be concave. Therefore, a c-plane 6c of the second crystal layer 6 is curved in a concave spherical shape with respect to a plane perpendicular to a normal direction of the center of the main surface 6s of the second crystal layer 6. An off-angle $\theta_2$ formed by a c-axis 6ca with respect to the normal of the center of the main surface 6s of the second crystal layer 6 has a predetermined distribution.

S170: Slicing Step

Next, as illustrated in FIG. 2(f), for example, the second crystal layer 6 is sliced using a wire saw along a cut surface SS substantially perpendicular to the normal direction of the center of the main surface 6s of the second crystal layer 6.

Thereby, as illustrated in FIG. 2(g), the base substrate 10 as an as-sliced substrate is formed. At this time, the thickness of the base substrate 10 is, for example, 450 μm. The off-angle $\theta_3$ of the base substrate 10 may change from the off-angle $\theta_2$ of the second crystal layer 6 due to dependence on the slice direction.

S180: Polishing Step

Next, both sides of the base substrate 10 are polished by a polishing device. Thereby, the main surface 10s of the base substrate 10 is mirror-finished.

By the above-described base substrate preparation step S100, the base substrate 10 constituted by a single crystal of GaN is obtained.

The base substrate 10 has a diameter of, for example, 2 inches or more. The base substrate 10 has a thickness of, for example, 300 μm or more and 1 mm or less. The thickness of the base substrate 10 may be increased in advance by a length corresponding to an etching depth (surface roughness PV, which will be described later) in the etching step S190.

The main surface 10s of the base substrate 10 has, for example, a main surface (base surface) 10s which is an epitaxial growth surface. In the present embodiment, a low index crystal plane that is closest to the main surface 10s is, for example, a c-plane (+c plane) 10c.

The c-plane 10c of the base substrate 10 is curved in a concave spherical shape with respect to the main surface 10s.

The term "spherical" as used herein means a curved surface that approximates to a spherical surface. Further, "approximates to a spherical surface" as used herein means approximating to a surface of a perfect circular sphere or an elliptical sphere within a predetermined range of error.

In the present embodiment, the c-plane 10f of the base substrate 10 has, for example, a curved surface that approximates to a spherical surface in each of a cross section taken along the m-axis and a cross section taken along the a-axis. A radius of curvature of the c-plane 10c in the base substrate 10 is, for example, 1 m or more and less than 10 m.

Since the c-plane 10c of the base substrate 10 is curved, the off-angle $\theta_3$ formed by a c-axis 10ca with respect to the normal of the center of the main surface 10s of the base substrate 10 has a predetermined distribution.

In the present embodiment, a size of the off-angle $\theta_3$ at the center of the main surface 10s of the base substrate 10 is, for example, greater than 0° and 1° or less.

The size and a direction of the off-angle $\theta_3$ at the center of the main surface 10s of the base substrate 10 can be adjusted, for example, by adjusting a size and a direction of the off-angle $\theta_0$ of the crystal growth substrate 1 used in the above-described VAS method, and a slice angle and the slice direction in the slicing step S170.

In the present embodiment, the main surface 10s of the base substrate 10 is mirror-finished as described above, and a root mean square roughness RMS of the main surface 10s of the base substrate 10 is, for example, less than 1 nm. That is, the main surface 10s of the base substrate 10 is uniformly flat before the etching step S190 described below is performed. Therefore, the entire main surface 10s of the base substrate 10 can be uniformly roughened in the etching step S190 described below.

Further, in the present embodiment, since the base substrate 10 is manufactured by the above-described VAS method, the dislocation density in the main surface 10s of the base substrate 10 is low. Specifically, the dislocation density in the main surface 10s of the base substrate 10 is, for example, $3 \times 10^6$ cm$^{-2}$ or more and less than $1 \times 10^7$ cm$^{-2}$.

S190: Etching Step (Gas Etching Step, Surface Roughening Step)

After the base substrate 10 is prepared, the etching step S190 described below is performed using the base substrate 10 in which a mask layer has not been formed on the main surface 10s as illustrated in FIG. 3(a). The "mask layer" as used herein means a mask layer that has predetermined openings and is used in a so-called ELO (Epitaxial Lateral Overgrowth) method, for example.

In the etching step S190, the main surface 10s of the base substrate 10 is etched to roughen the main surface 10s as illustrated in FIG. 3(b). As a result, in the first step S200, which will be described later, three-dimensional growth of a first layer 30 can be promoted due to the roughened main surface 10s of the base substrate 10 (resulting from the main surface 10s).

"Roughening a surface" as used herein means, for example, making the state of the surface after the etching step S190 rougher than the state of the surface before the etching step S190. Alternatively, "roughening a surface" means, for example, making the surface rougher than a mirror (mirror-finished) surface.

In the following, "a direction extending along the main surface 10s" means a direction that extends along an imaginary plane that is obtained by averaging the roughened main surface 10s. Further, "an upper side of the main surface 10s" means an upper side in a direction perpendicular to the imaginary plane obtained by averaging the roughened main surface 10s.

Further, "a cross section perpendicular to the main surface 10s of the base substrate 10" means a cross section that is perpendicular to the imaginary plane obtained by averaging the roughened main surface 10s.

In the present embodiment, after the base substrate 10 is prepared, the base substrate 10 is placed into a predetermined vapor phase growth apparatus (e.g., HYPE apparatus) for growing the first layer 30 and a second layer 40, which will be described later. After the base substrate 10 is placed into the apparatus, in situ etching is performed on the main surface 10s of the base substrate 10 before the first step S200 described later, by supplying a predetermined etching gas to the main surface 10s of the base substrate 10 in the vapor phase growth apparatus.

In the etching step S190 of the present embodiment, the main surface 10s of the base substrate 10 is roughened so as to promote three-dimensional growth of the first layer 30 in the first step S200 described later, for example. Also, in the present embodiment, the main surface 10s of the base substrate 10 is roughened such that an average distance L between closest peaks in the first layer 30 is greater than 100 μm in the first step S200 described later, for example.

Specifically, at this time, for example, a plurality of deep valleys 10$dv$ that are relatively deep and a plurality of shallow valleys 10$sv$ that are relatively shallow are randomly formed in the main surface 10$s$ of the base substrate 10 as illustrated in FIG. 3(b). Thus, in the first step S200 described later, it is possible to make some recessed portions 30$p$ gradually disappear above the plurality of shallow valleys 10$sv$, and to gradually expand other recessed portions 30$p$ above the plurality of deep valleys 10$dv$, toward the upper side of the main surface 10$s$ of the base substrate 10. As a result, irregularities in a first surface 30$s$ of the first layer 30 can be made larger than irregularities in the main surface 10$s$ of the base substrate 10.

At this time, a surface roughness (largest difference in height) PV that is represented by a peak-to-valley value of the main surface 10$s$ of the base substrate 10 is, for example, 5 μm or more and 100 μm or less. If the surface roughness PV is less than 5 μm, three-dimensional growth of the first layer 30 may not be sufficiently promoted in the first step S200 described later. In contrast, in the present embodiment, the surface roughness is 5 μm or more, and therefore, three-dimensional growth of the first layer 30 can be sufficiently promoted. On the other hand, if the surface roughness PV is greater than 100 μm, it is difficult to maintain rigidity of the base substrate 10. Further, if the surface roughness PV is greater than 100 μm, a height from a valley 30$v$ to a peak 30$t$ of the first layer 30, which will be described later, may be excessively high. In contrast, in the present embodiment, the surface roughness is 100 μm or less, and therefore, rigidity of the base substrate 10 can be stably maintained. Further, since the surface roughness is 100 μm or less, the height from the valley 30$v$ to the peak 30$t$ of the first layer 30 described later can be kept from being excessively high.

Further, at this time, in a direction extending along the main surface 10$s$ of the base substrate 10, for example, a length by which each of the plurality of deep valleys 10$dv$ linearly extends is made longer than a length by which each of the plurality of shallow valleys 10$sv$ linearly extends. With this configuration, the recessed portions 30$p$ of the first layer 30 can be easily expanded above the deep valleys 10$dv$ of the base substrate 10 in the first step S200 described later.

Further, at this time, in the direction extending along the main surface 10$s$ of the base substrate 10, for example, a distance between two deep valleys 10$dv$ that do not intersect and are adjacent to each other among the plurality of deep valleys 10$dv$ is made longer than a distance between two shallow valleys 10$sv$ that do not intersect and are adjacent to each other among the plurality of shallow valleys 10$sv$. Thus, it is possible to increase the average distance L between closest peaks of the first layer 30 in the first step S200 described later.

Specifically, in the direction extending along the main surface 10$s$ of the base substrate 10, an average distance between two deep valleys 10$dv$ that do not intersect and are adjacent to each other among the plurality of deep valleys 10$dv$ is, for example, greater than 50 μm, and preferably greater than 100 μm. Thus, it is possible to make the average distance L between closest peaks of the first layer 30 greater than 100 μm in the first step S200 described later.

Further, at this time, for example, etching is performed such that the c-plane 10$c$ is removed from the main surface 10$s$ of the base substrate 10. Thus, in the first step S200 described later, it is possible to easily obtain the first layer 30 that includes the first surface 30$s$ from which the c-plane has disappeared. Even when the c-plane 10$c$ remains in the main surface 10$s$ of the base substrate 10 in the etching step S190, the c-plane will disappear from the first surface 30$s$ of the first layer 30 so long as a first growth condition, which will be described later, satisfies formula (1).

At least either of a gas that contains chlorine (Cl) and $H_2$ gas is used as the etching gas in the etching step S190. As the gas containing Cl, for example, at least either of hydrogen chloride (HCl) gas and chlorine ($Cl_2$) gas is used. In such gas etching, the etching depth can be increased by increasing the etching period, for example. An etching rate can be increased by increasing an etching temperature, for example. The shape of the main surface 10$s$ after the above-described etching, the surface roughness PV, and the like can be adjusted by adjusting the type of the etching gas, a partial pressure of the etching gas, the etching temperature, and the like.

Etching conditions in the etching step S190 are as follows, for example.

Partial pressure of HCl gas: 0 to 15 kPa, preferably 1 to 10 kPa

Partial pressure of $H_2$ gas: 0 to 150 kPa, preferably 70 to 110 kPa

Etching temperature: 650 to 1,150° C., preferably 900 to 1,100° C.

Etching period: 10 to 120 minutes, preferably 20 to 60 minutes

S200: First Step (First Layer Growth Step)

After the main surface 10$s$ of the base substrate 10 is roughened, a single crystal of a group III nitride semiconductor is epitaxially grown on the main surface 10$s$ of the base substrate 10 as illustrated in FIG. 3(c). Thereby, the first layer (three-dimensional growth layer) 30 is grown.

At this time, the first layer 30 is grown using the vapor phase growth apparatus in a state where the base substrate 10 of which the surface has been roughened is placed in the vapor phase growth apparatus.

At this time, due to the roughened main surface 10$s$ of the base substrate 10, a plurality of recessed portions 30$p$ formed by inclined interfaces 30$i$ other than the c-plane are generated in the surface of the single crystal, and at least some of the recessed portions 30$p$ are gradually expanded toward the upper side of the main surface 10$s$ of the base substrate 10. Thereby, the first layer 30 including the first surface 30$s$ from which the c-plane has disappeared and that is constituted only by the inclined interfaces 30$i$ is obtained.

That is, in the first step S200, the first layer 30 three-dimensionally grows due to the roughened main surface 10$s$ of the base substrate 10. Even though the first layer 30 is grown in such a manner, the first layer 30 is grown as a single crystal as described above. In this respect, the first layer 30 differs from a so-called low temperature growth buffer layer that is formed as an amorphous layer or a polycrystal on a dissimilar substrate such as sapphire before a group III nitride semiconductor is epitaxially grown on the dissimilar substrate.

The "first surface 30$s$" described above means a surface (main surface) of the first layer 30 and encompasses growth interfaces in a growth process of the first layer 30.

In the present embodiment, for example, a layer that is constituted by the same group III nitride semiconductor as the group III nitride semiconductor constituting the base substrate 10 is epitaxially grown as the first layer 30. Specifically, for example, a GaN layer is epitaxially grown as the first layer 30 by heating the base substrate 10 and supplying GaCl gas and $NH_3$ gas to the heated base substrate 10 by the HYPE method.

Here, when a condition under which the first layer 30 is grown in the first step S200 is referred to as a "first growth condition", in order to realize the above-described growth process, the first growth condition is set such that, for example, formula (1) described below is satisfied due to the roughened main surface 10s of the base substrate 10.

Figure 6:
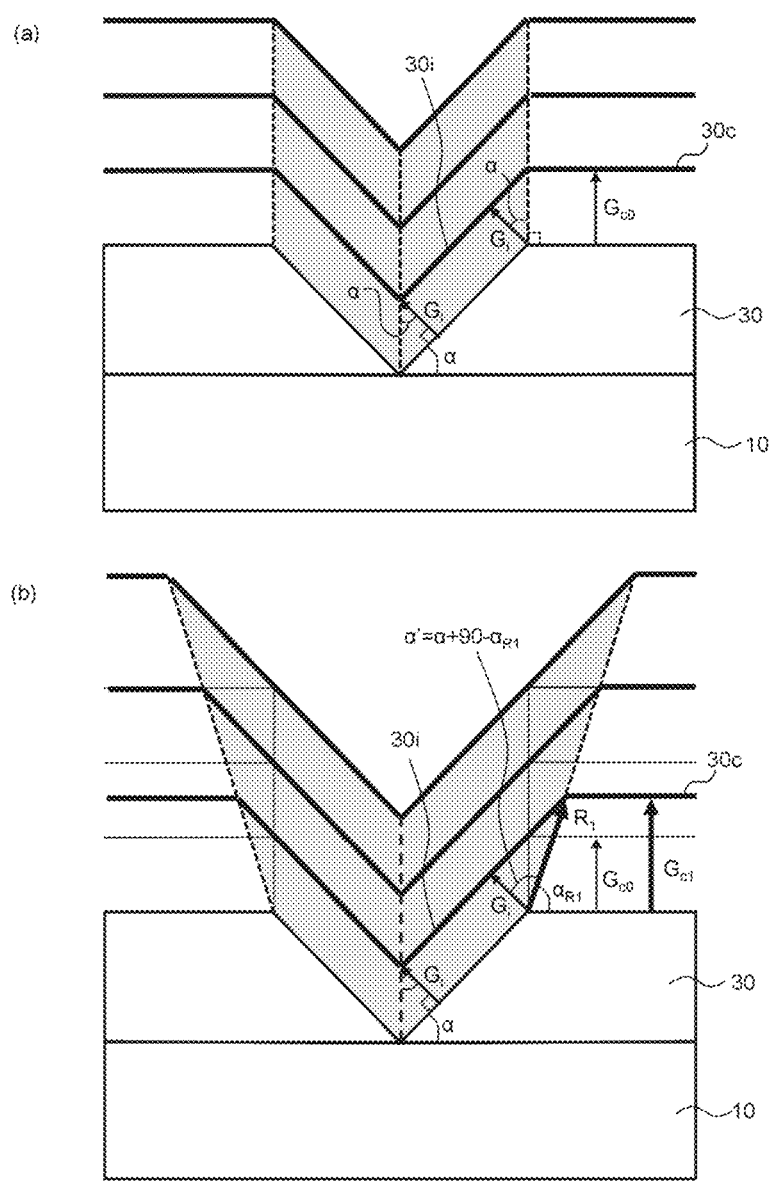
FIG. 6(a) is a schematic cross-sectional view illustrating a growth process under a reference growth condition under which an inclined interface and a c-plane are neither expanded nor contracted.
FIG. 6(b) is a schematic cross-sectional view illustrating a growth process under a first growth condition under which the inclined interface is expanded and the c-plane is contracted.

First, a reference growth condition under which the inclined interface 30i and the c-plane c are neither expanded nor contracted will be described with reference to FIG. 6(a). FIG. 6(a) is a schematic cross-sectional view illustrating a growth process under the reference growth condition under which the inclined interface and the c-plane are neither expanded nor contracted.

In FIG. 6(a), a thick solid line indicates the surface of the first layer 30 for each unit time. The inclined interface 30i illustrated in FIG. 6(a) is the inclined interface that is most inclined with respect to the c-plane c.

Further, in FIG. 6(a), $G_{c0}$ represents a growth rate of the c-plane of the first layer 30, $G_i$ represents a growth rate of the inclined interface 30i of the first layer 30, and α represents an angle formed by the c-plane and the inclined interface 30i in the first layer 30. Also, in FIG. 6(a), the first layer 30 grows while maintaining the angle α formed by the c-plane and the inclined interface 30i. The off-angle of the c-plane of the first layer 30 is negligible as compared with the angle α formed by the c-plane and the inclined interface 30i.

As illustrated in FIG. 6(a), when each of the inclined interface 30i and the c-plane is neither expanded nor contracted, a locus of an intersection between the inclined interface 30i and the c-plane is perpendicular to the c-plane. Therefore, the reference growth condition under which each of the inclined interface 30i and the c-plane is neither expanded nor contracted satisfies the following formula (a).

$$G_{c0}=G_i/\cos\alpha \qquad (a)$$

Next, the first growth condition under which the inclined interface 30i is expanded and the c-plane is contracted will be described with reference to FIG. 6(b). FIG. 6(b) is a schematic cross-sectional view illustrating a growth process under the first growth condition under which the inclined interface is expanded and the c-plane is contracted.

In FIG. 6(b), as in FIG. 6(a), a thick solid line indicates the first surface 30s (growth interface) of the first layer 30 for each unit time. Further, the inclined interface 30i illustrated in FIG. 6(b) is also the inclined interface most inclined with respect to the c-plane. Also, in FIG. 6(b), $G_{c1}$ represents a growth rate of the c-plane of the first layer 30, and $R_1$ represents a progress rate of the locus of the intersection between the inclined interface 30i and the c-plane of the first layer 30. Further, $\alpha_{R1}$ represents a narrower angle of angles formed by the c-plane and the locus of the intersection between the inclined interface 30i and the c-plane. When α' represents an angle formed by $R_1$ direction and $G_1$ direction, $\alpha'=\alpha+90-\alpha_{R1}$ is satisfied. The off-angle of the c-plane of the first layer 30 is negligible as compared with the angle α formed by the c-plane and the inclined interface 30i.

As illustrated in FIG. 6(b), the progress rate $R_1$ of the locus of the intersection between the inclined interface 30i and the c-plane is represented by the following formula (b).

$$R_1=G_i/\cos\alpha' \qquad (b)$$

Further, the growth rate $G_{c1}$ of the c-plane of the first layer 30 is represented by the following formula (c).

$$G_{c1}=R_1\sin\alpha_{R1} \qquad (c)$$

By substituting the formula (b) into the formula (c), $G_{c1}$ is represented by the following formula (d) using $G_i$.

$$G_{c1}=G_i\sin\alpha_{R1}/\cos(\alpha+90-\alpha_{R1}) \qquad (d)$$

In order for the inclined interface 30i to expand and the c-plane to contract, $\alpha_{R1}<90°$ is preferable. Accordingly, the first growth condition under which the inclined interface 30i is expanded and the c-plane is contracted preferably satisfies the following formula (1), due to satisfying formula (d) and $\alpha_{R1}<90°$, $$G_{c1}>G_i/\cos\alpha \qquad (1)$$

wherein, as described above, $G_1$ represents the growth rate of the inclined interface 30i most inclined with respect to the c-plane and a represents the angle formed by the inclined interface 30i most inclined with respect to the c-plane, and the c-plane.

Alternatively, it can be considered that $G_{e1}$ under the first growth condition is preferably larger than $G_{c0}$ under the reference growth condition. In this respect as well, the formula (1) can be derived by substituting the formula (a) into $G_{c1}>G_{c0}$.

Since the growth condition for expanding the inclined interface 30i most inclined with respect to the c-plane is the strictest condition, when the first growth condition satisfies the formula (1), the other inclined interfaces 30i can also be expanded.

Specifically, for example, when the inclined interface 30i most inclined with respect to the c-plane is the {10-11} plane, α=61.95°. Accordingly, the first growth condition preferably satisfies, for example, the following formula (1').

$$G_{c1}>2.13G_i \qquad (1')$$

Alternatively, for example, when inclined interfaces 30i are {11-2m} planes satisfying m≥3 as described later, the inclined interface 30i most inclined with respect to the c-plane is the {11-23} plane, and therefore, α=47.3°. Accordingly, the first growth condition preferably satisfies, for example, the following formula (1'').

$$G_{c1}>1.47G_i \qquad (1'')$$

As described above, in the present embodiment, spontaneous three-dimensional growth of the first layer 30 can be promoted due to the roughened main surface 10s of the base substrate 10. Therefore, even when the range of the first growth condition is increased, the first growth condition can satisfy the formula (1). Specifically, as the first growth condition, at least any of the growth temperature in the first step S200, a ratio (hereinafter also referred to as "V/III ratio") of a partial pressure of $NH_3$ gas serving as a nitrogen source gas to a partial pressure of GaCl gas serving as a group III source gas in the first step S200, and the like can be made substantially equal to a second growth condition in a second step S300, which will be described later, for example.

In this case, as the first growth condition, the growth temperature in the first step S200 is set to 990° C. or higher and 1,120° C. or lower, and preferably 1,020° C. or higher and 1,100° C. or lower.

Also, in this case, as the first growth condition, the V/III ratio in the first step S200 is set to 1 or more and 10 or less, and preferably 1 or more and 5 or less.

However, if the effect of the roughened main surface 10s of the base substrate 10 promoting three-dimensional growth of the first layer 30 is insufficient or the three-dimensional growth of the first layer 30 is to be further promoted, the first growth condition, which is the growth temperature in the first step S200, the V/III ratio in the first step S200, or the like, may be set to be different from the second growth condition in the second step S300 described later, so that the first growth condition satisfies the formula (1) without only depending on the roughened main surface 10s of the base substrate 10.

In this case, as the first growth condition, for example, the growth temperature in the first step S200 may be lower than the growth temperature in the second step S300 described later. Specifically, the growth temperature in the first step S200 may be, for example, 980° C. or higher and 1,020° C. or lower, preferably 1,000° C. or higher and 1,020° C. or lower.

Further, in this case, as the first growth condition, for example, the V/III ratio in the first step S200 may be larger than the V/III ratio in the second step S300 described later. Specifically, the V/III ratio in the first step S200 may be, for example, 2 or more and 20 or less, preferably 2 or more and 15 or less.

Other conditions of the first growth condition according to the present embodiment are as follows, for example.
Growth pressure: 90 to 105 kPa, preferably 90 to 95 kPa
Partial pressure of GaCl gas: 1.5 to 15 kPa
$N_2$ gas flow rate/$H_2$ gas flow rate: 0 to 1

Here, the first step S200 of the present embodiment is classified into two steps based on the form of the first layer 30 while growing, for example. Specifically, the first step S200 of the present embodiment includes, for example, a recessed portion expansion step S220 and an inclined interface maintenance step S240. Through these steps, for example, a recessed portion expanded layer 32 and an inclined interface maintaining layer 34 are formed as the first layer 30.

S220: Recessed Portion Expansion Step

First, as illustrated in FIG. 3(c), the recessed portion expanded layer 32 of the first layer 30 constituted by a single crystal of a group III nitride semiconductor is epitaxially grown on the main surface 10s of the base substrate 10 under the first growth condition described above.

In an initial stage of the growth of the recessed portion expanded layer 32, a plurality of recessed portions 30p formed by inclined interfaces 30i other than the c-plane are generated above the plurality of shallow valleys 10sv and the plurality of deep valleys 10dv in the first surface 30s of the recessed portion expanded layer 32.

Thereafter, as the recessed portion expanded layer 32 is gradually grown toward the upper side of the main surface 10s of the base substrate 10, some of the plurality of recessed portions 30p gradually disappear above the plurality of shallow valleys 10sv. Thereby, a plurality of peaks 30t are formed in portions of the first surface 30s of the recessed portion expanded layer 32 where the recessed portions 30p have disappeared. In a case where the c-plane 10c remains in a portion of the main surface 10s of the base substrate 10, the remaining c-plane 10c can disappear together with the recessed portions 30p that disappear above the shallow valleys 10sv.

On the other hand, as the recessed portion expanded layer 32 is gradually grown toward the upper side of the main surface 10s of the base substrate 10, the other recessed portions 30p are gradually expanded above the plurality of deep valleys 10dv. Thus, a plurality of valleys 30v are formed at lower ends of portions of the first surface 30s of the recessed portion expanded layer 32 where the other recessed portions 30p have been expanded. The recessed portions 30p do not have to be expanded above all of the deep valleys 10dv, and recessed portions 30p may disappear above some of the deep valleys 10d.

The plurality of valleys 30v are each an inflection point that is convex downward in the first surface 30s of the recessed portion expanded layer 32, and are formed above the deep valleys 10dv. On the other hand, the plurality of peaks 30t are each an inflection point that is convex upward in the first surface 30s of the recessed portion expanded layer 32, and are formed above positions near where shallow valleys 10sv (lastly) disappeared from. The valleys 30v and the peaks 30t are formed alternately in the direction extending along the main surface 10s of the base substrate 10.

As a result, the recessed portion expanded layer 32 including the first surface 30s from which the c-plane has disappeared and that is constituted only by the inclined interfaces 30i is formed.

The term "inclined interface 30i" as used herein means a growth interface inclined with respect to the c-plane, and includes low-index facets other than the c-plane, high-index facets other than the c-plane, and inclined faces that cannot be represented by indices of crystal plane (Miller indices). Facets other than the c-plane are, for example, {11-2m}, 11-10111, and the like. Wherein m and n are integers other than 0.

In the present embodiment, since the first growth condition satisfies the formula (1) due to the roughened main surface 10s of the base substrate 10, for example, a {11-2m} plane satisfying m≥3 can be generated as the inclined interface 30i. Thereby, an inclination angle of the {11-2m} plane with respect to the c-plane can be made moderate. Specifically, the inclination angle can be 47.3° or less.

When the recessed portion expanded layer 32 is further grown, the inclination angle formed by the inclined interfaces 30i with respect to the main surface 10s of the base substrate 10 gradually decreases toward the upper side of the base substrate 10 due to the roughened main surface 10s of the base substrate 10. Thereby, most of the inclined interfaces 30i finally become {11-2m} planes satisfying m≥3 as described above.

Due to the growth process of the recessed portion expanded layer 32 described above, dislocations bend and propagate as follows. Specifically, as illustrated in FIG. 3(c), a plurality of dislocations extending along the c-axis in the base substrate 10 propagate from the base substrate 10 in a direction extending along the c-axis of the recessed portion expanded layer 32. In a region (first low oxygen concentration region 60, which will be described later) of the recessed portion expanded layer 32 that has grown while some of the plurality of recessed portions 30p gradually disappeared, the dislocations propagate in the direction extending along the c-axis of the recessed portion expanded layer 32. However, when a growth interface at which the dislocations are exposed changes to an inclined interface 30i of the first layer 30 in the recessed portion expanded layer 32, the dislocations bend and propagate in a direction that is substantially perpendicular to the inclined interface 30i. That is, the dislocations bend and propagate in a direction that is inclined with respect to the c-axis. Thereby, in the steps after the recessed portion expansion step S220, the dislocations are locally collected above substantially the center between each pair of peaks 30t. As a result, a dislocation density in a second surface 40s of the second layer 40, which will be described later, can be lowered.

At this time, in the present embodiment, when an arbitrary cross section perpendicular to the main surface 10s of the base substrate 10 is observed, an average distance (also called "an average distance between closest peaks") L between a pair of peaks 30t spaced apart from each other in the direction extending along the main surface 10s of the base substrate 10 is, for example, greater than 100 μm, the pair of peaks being closest to each other among the plurality of peaks 30t with one of the plurality of valleys 30v sandwiched between them. The average distance L between closest peaks is a distance of the case where, in the observed cross section, the c-plane has disappeared from the first surface 30s and the first surface 30s is constituted only by the inclined interfaces 30i. Further, at this time, the average distance L between closest peaks is greater than 100 μm due to the roughened main surface 10s of the base substrate 10.

If the average distance L between closest peaks is 100 μm or less, a distance by which the dislocations bend and propagate in the steps after the recessed portion expansion step S220 becomes short. Therefore, the dislocations cannot be sufficiently collected above substantially the center between each pair of peaks 30t of the recessed portion expanded layer 32. As a result, the dislocation density in the second surface 40s of the second layer 40 described later may not be sufficiently lowered. In contrast, in the present embodiment, since the average distance L between closest peaks is greater than 100 μm, at least a distance longer than 50 μm can be secured for the dislocations to bend and propagate in the steps after the recessed portion expansion step S220. Thereby, the dislocations can be sufficiently collected above substantially the center between each pair of peaks 30t of the recessed portion expanded layer 32. As a result, the dislocation density in the second surface 40s of the second layer 40 described later can be sufficiently lowered.

On the other hand, in the present embodiment, the average distance L between closest peaks is less than 800 μm due to the roughened main surface 10s of the base substrate 10. If the average distance L between closest peaks is 800 μm or more, the height from the valley 30v to the peak 30t of the recessed portion expanded layer 32 becomes excessively large. Therefore, the thickness of the second layer 40 until the second layer is mirror-finished in the second step S300 described later becomes large. In contrast, in the present embodiment, since the average distance L between closest peaks is less than 800 μm, the height from the valley 30v to the peak 30t of the recessed portion expanded layer 32 can be lowered. Therefore, the second layer 40 can be quickly mirror-finished in the second step S300 described later.

Further, at this time, the first low oxygen concentration region 60 and a high oxygen concentration region 70 (gray part in the figure) are formed in the recessed portion expanded layer 32, based on a difference in oxygen concentration.

Further, at this time, in the first low oxygen concentration region 60, mountains 60x are formed above portions from which some of the plurality of recessed portions 30p have disappeared. Further, in the first low oxygen concentration region 60, a pair of inclined portions 60i are formed on opposite sides of each mountain 60x as loci of the other recessed portions 30p that are gradually expanded.

Further, at this time, an angle β formed by the pair of inclined portions 60i is, for example, 70° or less in a cross section taken along a plane that passes through centers of two expanded recessed portions 30p adjacent to each other, due to the first growth condition satisfying the formula (1).

Details of these regions will be described later.

S240: Inclined Interface Maintenance Step

After the first surface 30s from which the c-plane has disappeared is obtained due to the roughened main surface 10s of the base substrate 10, as illustrated in FIG. 4(a), the growth of the first layer 30 is continued over a predetermined thickness while a state where the inclined interfaces 30i occupy a larger portion of the first surface 30s than the c-plane, or preferably a state where the first surface 30s is constituted only by the inclined interfaces 30i is maintained due to the roughened main surface 10s of the base substrate 10. Thereby, the inclined interface maintaining layer 34 that has a surface in which the inclined interfaces 30i occupy a larger portion than the c-plane is formed on the recessed portion expanded layer 32. By forming the inclined interface maintaining layer 34, it is possible to make sure that the c-plane disappears over the entire first surface 30s of the first layer 30.

Note that a part in which the c-plane is generated may be formed in the growth process of the inclined interface maintaining layer 34.

Here, in order to reliably bend the propagation direction of dislocations in the first step S200 as described above to lower the dislocation density, it is important that the c-plane 30c disappears at least once in a history of a growth interface at an arbitrary position in the first layer 30. Therefore, it is desirable that the c-plane 30c disappears at least once in an early stage of the first step S200 (e.g., in the recessed portion expansion step S220 described above).

However, the c-plane 30c may reappear in a part of the surface of the inclined interface maintaining layer 34 in the inclined interface maintenance step S240 after the c-plane 30c has disappeared at least once. However, it is preferable to mainly expose the inclined interfaces 30i at the surface of the inclined interface maintaining layer 34, so that an area ratio of the inclined interface growth region 70 is 80% or more in a cross section taken along the main surface 10s of the base substrate 10. The higher the area ratio occupied by the inclined interface growth region 70 in the cross section, the better, and it is preferable that the area ratio is 100%.

Further, it is also possible to make some of the recessed portions 30p constituting the valleys 30v disappear and expand the other recessed portions 30p in the growth process of the inclined interface maintaining layer 34. That is, irregularities in the first surface 30s of the inclined interface maintaining layer 34 may be gradually enlarged.

At this time, in the inclined interface maintenance step S240 as well, the first growth condition is maintained so that the formula (1) is satisfied due to the roughened main surface 10s of the base substrate 10 similarly to the recessed portion expansion step S220. Thereby, the inclined interface maintaining layer 34 can grow, with only the inclined interfaces 30i as growth surfaces.

Further, at this time, by growing the inclined interface maintaining layer 34 with the inclined interfaces 30i as growth surfaces, the dislocations that bend and propagate in the direction inclined with respect to the c-axis at positions where the inclined interfaces 30i are exposed in the recessed portion expanded layer 32 as described above continue to propagate in the same direction in the inclined interface maintaining layer 34.

Further, at this time, the inclined interface maintaining layer 34 grows with the inclined interfaces 30i as growth surfaces, and accordingly, the entire inclined interface maintaining layer 34 becomes a part of the high oxygen concentration region 70.

Through the first step S200 described above, the first layer 30 including the recessed portion expanded layer 32 and the inclined interface maintaining layer 34 is formed.

In the first step S200 of the present embodiment, the height from the main surface 10s of the base substrate 10 to the peak 30t of the first layer 30 (the maximum height in the thickness direction of the first layer 30) is, for example, greater than 100 μm and less than 1.5 mm, as a result of the first layer 30 being three-dimensionally grown due to the roughened main surface 10s of the base substrate 10.

In a case where the first growth condition, which is the growth temperature in the first step S200, the V/III ratio in the first step S200, or the like, is substantially equal to the second growth condition in the second step S300 described later, as described above, the mode of crystal growth spontaneously transitions from that in the first step S200 to that in the second step S300.

S300: Second Step (Second Layer Growth Step, Flattening Step)

After the first layer 30 in which the c-plane has disappeared is grown, a single crystal of a group III nitride semiconductor is further epitaxially grown on the first layer 30 as illustrated in FIGS. 4(b) and 5(a).

At this time, inclined interfaces 40i are gradually contracted and a c-plane 40c is gradually expanded toward the upper side of the first layer 30. Thereby, the inclined interfaces 30i formed at the first surface 30s of the first layer 30 disappear. As a result, the second layer (flattening layer) 40 including the mirror-finished second surface 40s is grown.

The "mirror surface (mirror-finished surface)" as used herein means a surface in which the largest difference in height between a recessed portion and a raised portion of the surface that are adjacent to each other is no greater than a wavelength of visible light. Also, the "second surface 40s" referred to herein means a surface (main surface) of the second layer 40 and encompasses growth interfaces in a growth process of the second layer 40.

In the present embodiment, for example, a layer that is mainly composed of the same group III nitride semiconductor as the group III nitride semiconductor constituting the first layer 30 is epitaxially grown as the second layer 40. In the second step S300, a silicon (Si)-doped GaN layer is epitaxially grown as the second layer 40 by supplying GaCl gas, $NH_3$ gas, and dichlorosilane ($SiH_2Cl_2$) gas as an n-type dopant gas to the base substrate 10 heated to a predetermined growth temperature. As the n-type dopant gas, $GeCl_4$ gas or the like may be supplied instead of the $SiH_2Cl_2$ gas.

Here, when a condition under which the second layer 40 is grown in the second step S300 is referred to as the "second growth condition", in order to realize the above-described growth process, the second growth condition is set so as to satisfy, for example, formula (2) described below.

Figure 7:
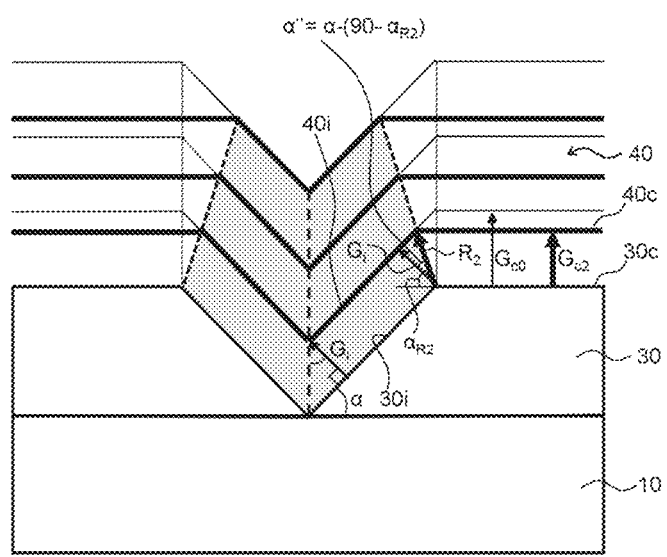
FIG. 7 is a schematic cross-sectional view illustrating a growth process under a second growth condition under which the inclined interface is contracted and the c-plane is expanded.

The second growth condition under which the inclined interface 40i is contracted and the c-plane 40c is expanded will be described with reference to FIG. 7. FIG. 7 is a schematic cross-sectional view illustrating a growth process under the second growth condition under which the inclined interface is contracted and the c-plane is expanded. FIG. 7 illustrates a process of the second layer 40 growing on the first layer 30 where an inclined interface 30i that is most inclined with respect to the c-plane is exposed.

In FIG. 7, as in FIG. 6(a), the thick solid line indicates the second surface 40s (growth interface) of the second layer 40 for each unit time. Further, in FIG. 7, $G_{c2}$ represents a growth rate of the c-plane 40c of the second layer 40, $G_1$ represents a growth rate of the inclined interface 40i of the second layer 40, and $R_2$ represents a progress rate of a locus of an intersection between the inclined interface 40i and the c-plane 40c in the second layer 40. Further, $\alpha_{R2}$ represents a narrower angle of angles formed by the c-plane and the locus of the intersection between the inclined interface 40i and the c-plane 40c. When $\alpha''$ represents an angle formed by $R_2$ direction and $G_1$ direction, $\alpha'' = \alpha - (90 - \alpha_{R2})$ is satisfied. Further, in FIG. 7, the second layer 40 grows while maintaining the angle $\alpha$ formed by the c-plane and the inclined interface 30i in the first layer 30. The off-angle of the c-plane 40c of the second layer 40 is negligible as compared with the angle $\alpha$ formed by the c-plane and the inclined interface 30i.

As illustrated in FIG. 7, the progress rate $R_2$ of the locus of the intersection between the inclined interface 40i and the c-plane 40c is represented by the following formula (e).

$$R_2 = G_i / \cos \alpha'' \tag{e}$$

Further, the growth rate $G_{c2}$ of the c-plane 40c of the second layer 40 is represented by the following formula (f).

$$G_{c2} = R_2 \sin \alpha_{R2} \tag{f}$$

By substituting the formula (e) into the formula (f), $G_{c2}$ is represented by the following formula (g) using $G_i$.

$$G_{c2} = G_i \sin \alpha_{R2} / \cos(\alpha + \alpha_{R2} - 90) \tag{g}$$

In order for the inclined interface 40i to contract and the c-plane 40c to expand, $\alpha_{R2} < 90°$ is preferable. Accordingly, the second growth condition under which the inclined interface 40i is contracted and the c-plane 40c is expanded preferably satisfies the following formula (2), due to satisfying the formula (g) and $\alpha_{R2} < 90°$, $$G_{c2} < G_i / \cos \alpha \tag{2}$$

wherein, as described above, $G_i$ represents the growth rate of the inclined interface 40i most inclined with respect to the c-plane 40c, and $\alpha$ a represents the angle formed by the c-plane 40c and the inclined interface 40i most inclined with respect to the c-plane 40c.

Alternatively, when the growth rate of the c-plane in the second layer 40 under the reference growth condition is represented by $G_{c0}$, it can also be considered that $G_{c2}$ under the second growth condition is preferably smaller than $G_{c0}$ under the reference growth condition. In this respect as well, the formula (2) can be derived by substituting the formula (a) into $G_{c2} < G_{c0}$.

Since the growth condition for contracting the inclined interface 40i most inclined with respect to the c-plane 40c is the strictest condition, when the second growth condition satisfies the formula (2), the other inclined interfaces 40i can also be contracted.

Specifically, when the inclined interface 40i most inclined with respect to the c-plane 40c is the {10-11} plane, the second growth condition preferably satisfies the following formula (2').

$$G_{c2} < 2.13 G_i \tag{2'}$$

Alternatively, for example, when the inclined interfaces 30i are {11-2m} planes satisfying m 3, the inclined interface 30i most inclined with respect to the c-plane is the {11-23} plane, and therefore, the second growth condition preferably satisfies, for example, the following formula (2").

$$G_{c2} < 1.47 G_i \tag{2''}$$

In the second step S300 of the present embodiment, the roughened main surface 10s of the base substrate 10 has already lost its influence. Therefore, the second growth condition, which is the growth temperature in the second step S300, the V/III ratio in the second step, or the like is adjusted so as to satisfy the formula (2), without taking the state of the main surface 10s of the base substrate 10 into consideration.

Specifically, as the second growth condition, the growth temperature in the second step S300 is set to, for example, 990° C. or higher and 1,120° C. or lower, preferably 1,020° C. or higher and 1,100° C. or lower.

Further, as the second growth condition, the V/III ratio in the second step S300 is set to, for example, 1 or more and 10 or less, preferably 1 or more and 5 or less.

Other conditions of the second growth condition of the present embodiment are, for example, as follows.

Growth pressure: 90 to 105 kPa, preferably 90 to 95 kPa
Partial pressure of GaCl gas: 1.5 to 15 kPa
$N_2$ gas flow rate/$H_2$ gas flow rate: 1 to 20

Here, the second step S300 of the present embodiment is classified into two steps based on the form of the second layer 40 while growing, for example. Specifically, the second step S300 of the present embodiment includes, for example, a c-plane expansion step S320 and a main growth step S340. Through these steps, for example, a c-plane expanded layer 42 and a main growth layer 44 are formed as the second layer 40.

S320: c-plane Expansion Step

As illustrated in FIG. 4(b), the c-plane expanded layer 42 of the second layer 40 constituted by a single crystal of a group III nitride semiconductor is epitaxially grown on the first layer 30 under the above-described second growth condition.

At this time, the roughened main surface 10s of the base substrate 10 has already lost its influence as described above, and accordingly, the c-plane 40c is expanded and the inclined interfaces 40i other than the c-plane are contracted toward the upper side of the first layer 30 due to growth that depends only on the second growth condition.

Specifically, due to the growth under the second growth condition, the c-plane expanded layer 42 grows from the inclined interfaces 30i of the inclined interface maintaining layer 34 in a direction perpendicular to the c-axis (that is, a direction extending along the surface or a lateral direction) with the inclined interfaces 40i as growth surfaces. When the c-plane expanded layer 42 is grown laterally, the c-plane 40c of the c-plane expanded layer 42 begins to be exposed again above the peaks 30t of the inclined interface maintaining layer 34. Thereby, the c-plane expanded layer 42 is formed, in which the c-plane 40c and the inclined interfaces 40i other than the c-plane coexist at the second surface 40s.

When the c-plane expanded layer 42 is further grown laterally, the c-plane 40c gradually expands, and the inclined interfaces 40i of the c-plane expanded layer 42 gradually contract. Thereby, the recessed portions 30p formed by the plurality of inclined interfaces 30i in the first surface 30s of the first layer 30 are gradually embedded.

Thereafter, when the c-plane expanded layer 42 is further grown, the inclined interfaces 40i of the c-plane expanded layer 42 completely disappear, and the recessed portions 30p formed by the plurality of inclined interfaces 30i in the first surface 30s of the first layer 30 are completely embedded. Thereby, the second surface 40s of the c-plane expanded layer 42 becomes a mirror-finished surface (flat surface) that is constituted only by the c-plane 40c.

At this time, the dislocation density can be lowered by locally collecting dislocations during the growth process of the first layer 30 and the c-plane expanded layer 42. Specifically, the dislocations that bend and propagate in the direction inclined with respect to the c-axis in the first layer 30 continue to propagate in the same direction in the c-plane expanded layer 42. Thereby, the dislocations are collected locally at a meeting part of adjacent inclined interfaces 40i above substantially the center between each pair of peaks 30t in the c-plane expanded layer 42. Out of a plurality of dislocations collected at meeting parts of adjacent inclined interfaces 40i of the c-plane expanded layer 42, dislocations that have Burgers vectors opposite to each other disappear when meeting each other. Further, some of the dislocations collected at the meeting parts of the adjacent inclined interfaces 40i form a loop, and the propagation along the c-axis (that is, toward the second surface 40s side of the c-plane expanded layer 42) is suppressed. The other dislocations of the plurality of dislocations collected at the meeting parts of the adjacent inclined interfaces 40i of the c-plane expanded layer 42 change their propagation direction again from the direction inclined with respect to the c-axis to a direction extending along the c-axis, and propagate to the second surface 40s side of the second layer 40. In this way, by making some of the plurality of dislocations disappear and suppressing propagation of some of the plurality of dislocations to the second surface 40s side of the c-plane expanded layer 42, the dislocation density in the second surface 40s of the second layer 40 can be lowered. Further, by collecting the dislocations locally, a low dislocation density region can be formed above a portion of the second layer 40 in which dislocations propagate in the direction inclined with respect to the c-axis.

Further, at this time, since the c-plane 40c gradually expands in the c-plane expanded layer 42, a second low oxygen concentration region 80 that grows with the c-plane 40c as a growth surface, which will be described later, is formed while gradually expanding toward the upper side in the thickness direction.

On the other hand, in the c-plane expanded layer 42, as the inclined interfaces 40i gradually contract, the high oxygen concentration region 70 gradually contracts toward the upper side in the thickness direction, and terminates at a predetermined position in the thickness direction. Due to the above-described growth process of the c-plane expanded layer 42, valleys 70a of the high oxygen concentration region 70 are formed at positions at which the c-plane 40c is generated again. Further, in the process of recessed portions formed by the inclined interfaces 40i being gradually embedded, mountains 70b of the high oxygen concentration region 70 are formed at positions at which the inclined interfaces 40i disappear.

In the c-plane expansion step S320, the second surface 40s of the c-plane expanded layer 42 becomes a mirror-finished surface that is constituted only by the c-plane 40c, and therefore the height of the c-plane expanded layer 42 in the thickness direction (maximum height in the thickness direction) is, for example, greater than or equal to the height from the valley 30v to the peak 30t of the inclined interface maintaining layer 34.

S340: Main Growth Step (c-Plane Growth Step)

When the inclined interfaces 40i have disappeared from the c-plane expanded layer 42 and the second surface 40s has been mirror-finished, as illustrated in FIG. 5(a), the main growth layer 44 is formed on the c-plane expanded layer 42 over a predetermined thickness with the c-plane 40c as a growth surface. Thereby, the main growth layer 44 that includes only the c-plane 40c at the second surface 40s and does not include the inclined interfaces 40i is formed.

At this time, the above-described second growth condition is maintained in the main growth step S340, similarly to the c-plane expansion step S320. Thereby, step-flow growth of the main growth layer 44 can be caused with the c-plane 40c as a growth surface.

Further, at this time, a radius of curvature of the c-plane 40c of the main growth layer 44 can be made larger than a radius of curvature of the c-plane 10c of the base substrate 10. Thereby, a variation in the off-angle of the c-axis with respect to the normal of the second surface 40s of the main growth layer 44 can be made smaller than the variation in the off-angle of the c-axis 10ca with respect to the normal of the main surface 10s of the base substrate 10.

Further, at this time, by growing the main growth layer 44 with only the c-plane 40c as a growth surface without exposing the inclined interfaces 40i, the entire main growth layer 44 is formed as the second low oxygen concentration region 80, which will be described later.

In the main growth step S340, the thickness of the main growth layer 44 is, for example, 300 µm or more and 10 mm or less. Since the thickness of the main growth layer 44 is 300 µm or more, at least one or more substrates 50 can be sliced from the main growth layer 44 in the slicing step S400 described later. On the other hand, if the thickness of the main growth layer 44 is 10 mm, at least ten substrates 50 can be obtained when a final thickness is 650 µm, and 700 µm-thick substrates 50 are sliced from the main growth layer 44, even if a kerf loss of about 200 µm is taken into consideration.

Through the second step S300 described above, the second layer 40 including the c-plane expanded layer 42 and the main growth layer 44 is formed. As a result, a laminated structure 90 of the present embodiment is formed.

That is, the etching step S190, the first step S200, and the second step S300 are continuously performed in the same vapor phase growth apparatus without exposing the base substrate 10 to the atmosphere. Thereby, it is possible to suppress unintended formation of a high oxygen concentration region (a region having an oxygen concentration that is excessively higher than that of the high oxygen concentration region 70) at an interface between the main surface 10s of the base substrate 10 and the first layer 30 and at an interface between the first layer 30 and the second layer 40.

S400: Slicing Step

Next, as illustrated in FIG. 5(b), for example, the main growth layer 44 is sliced using a wire saw along a cut surface that is substantially parallel to the second surface 40s of the main growth layer 44. Thereby, at least one nitride semiconductor substrate 50 (also referred to as a substrate 50) as an as-sliced substrate is formed. At this time, the thickness of the substrate 50 is, for example, 300 µm or more and 700 µm or less.

At this time, the radius of curvature of a c-plane 50c of the substrate 50 can be larger than the radius of curvature of the c-plane 10c of the base substrate 10. Also, at this time, the radius of curvature of the c-plane 50c of the substrate 50 can be larger than the radius of curvature of the c-plane 40c of the main growth layer 44 before slicing. Thereby, the variation in the off-angle θ of a c-axis 50ca with respect to the normal of the main surface 50s of the substrate 50 can be made smaller than the variation in the off-angle of the c-axis 10ca of the base substrate 10.

S500: Polishing Step

Next, both sides of the substrate 50 are polished using a polishing device. At this time, the thickness of the final substrate 50 is, for example, 250 µm or more and 650 µm or less.

The substrate 50 according to the present embodiment is manufactured by the above steps s100 to s500.

Step of Preparing Semiconductor Laminate and Step of Preparing Semiconductor Device After the substrate 50 is manufactured, for example, a semiconductor functional layer that is constituted by a group III nitride semiconductor is epitaxially grown on the substrate 50 to prepare a semiconductor laminate. After the semiconductor laminate is prepared, an electrode or the like is formed using the semiconductor laminate, and the semiconductor laminate is diced, and a chip having a predetermined size is cut out. Thereby, a semiconductor device is prepared.

(2) Laminated Structure

Next, the laminated structure 90 according to the present embodiment will be described with reference to FIG. 5(a).

The laminated structure 90 of the present embodiment includes, for example, the base substrate 10, the first layer 30, and the second layer 40.

The base substrate 10 includes, for example, the main surface 10s that is roughened through etching. A low index crystal plane that is closest to an imaginary plane obtained by averaging the main surface 10s is the c-plane ((0001) plane). The main surface 10s includes, for example, the deep valleys 10dv and the shallow valleys 10sv.

The first layer 30 is formed by, for example, epitaxially growing a single crystal of a group III nitride semiconductor on the roughened main surface 10s of the base substrate 10, generating a plurality of recessed portions 30p formed by inclined interfaces 30i other than the c-plane in the surface of the single crystal due to the roughened main surface 10s of the base substrate 10, and expanding at least some of the recessed portions 30p toward the upper side of the main surface 10s of the base substrate 10.

The first layer 30 includes, for example, the plurality of valleys 30v and the plurality of peaks 30t. When an arbitrary cross section perpendicular to the main surface of the base substrate 10 is observed, the average distance L between closest peaks is, for example, greater than 100 µm.

Further, the first layer 30 includes, for example, the first low oxygen concentration region (first c-plane growth region) 60 and the high oxygen concentration region (inclined interface growth region) 70 based on a difference in oxygen concentration.

The first low oxygen concentration region 60 is formed, for example, in a region that grows while some of the plurality of recessed portions 30p disappear. The first low oxygen concentration region 60 has a lower oxygen concentration than the high oxygen concentration region 70, for example. However, the oxygen concentration in the first low oxygen concentration region 60 may be higher than an oxygen concentration in the second low oxygen concentration region 80.

The first low oxygen concentration region 60 includes, for example, a plurality of mountains 60x in a cross-sectional view. Each of the mountains 60x referred to herein means a part of a shape that is observed based on a difference in light emission intensity when a cross section of the laminated structure 90 is observed using a fluorescence microscope or the like, and does not mean a part of the shape of an outermost surface generated during the growth of the first layer 30. The plurality of mountains 60x are each an inflection point that is convex upward in the first low oxygen concentration region 60, and are formed above portions where some of the plurality of recessed portions 30p disappeared and terminated (last). The mountains 60x of the first low oxygen concentration region 60 and the deep valleys 10dv of the base substrate 10 are formed alternately in a direction extending along the main surface 10s of the base substrate 10.

When an arbitrary cross section perpendicular to the main surface 10s of the base substrate 10 is observed, an average distance between a pair of mountains 60x spaced apart from each other in the direction extending along the main surface 10s of the substrate 10 corresponds to the above-described average distance L between closest peaks of the first layer 30, and is, for example, greater than 100 µm, the pair of mountains 60x being closest to each other among the plurality of mountains 60x with one of the plurality of deep valleys 10dv sandwiched between them.

The first low oxygen concentration region 60 includes a pair of inclined portions 60i that are formed on opposite sides of each of the plurality of mountains 60x as loci of a plurality of recessed portions 30p that are gradually expanded. Each of the inclined portions 60i referred to herein means a part of a shape observed based on a difference in light emission intensity when a cross section of the laminated structure 90 is observed using a fluorescence microscope or the like, and does not mean the inclined interface 30i at the outermost surface generated during the growth of the first layer 30.

The angle β formed by the pair of inclined portions 60i is, for example, 70° or less, and preferably 20° or more and 65° or less (in a cross section taken along a plane that passes through centers of two expanded recessed portions 30p adjacent to each other, i.e., in a cross section taken along a plane that passes through centers of two adjacent deep valleys 10dv of the base substrate 10). The angle β formed by the pair of inclined portions 60i being 70° or less means that the ratio $G_{c1}/G_i$ is high, which is the ratio of the growth rate $G_{c1}$ of the c-plane of the first layer 30 to the growth rate $G_i$ of the inclined interface 30i most inclined with respect to the c-plane of the first layer 30. Thereby, the inclined interfaces 30i other than the c-plane can be easily generated, and at least some of the plurality of recessed portions 30p can be easily expanded. As a result, dislocations can be easily bent at positions where the inclined interfaces 30i are exposed. Further, if the angle β formed by the pair of inclined portions 60i is 65° or less, the inclined interfaces 30i other than the c-plane can be more easily generated, and at least some of the plurality of recessed portions 30p can be more easily expanded. Also, if the angle β formed by the pair of inclined portions 60i is 20° or more, it is possible to suppress an increase in the height from the valley 30v to the peak 30t of the first layer 30 to suppress an increase in the thickness of the second layer 40 until the second layer is mirror-finished.

On the other hand, the high oxygen concentration region 70 is formed, for example, in a region that grows with the inclined interfaces 30i other than the c-plane as growth surfaces while the other recessed portions 30p are gradually expanded. A lower surface of the high oxygen concentration region 70 conforms to, for example, the shape of the first low oxygen concentration region 60.

The high oxygen concentration region 70 is provided continuously along the main surface of the base substrate 10. That is, when a plurality of cross sections of the first layer 30 are taken along the main surface 10s of the base substrate 10, it is desirable that there is a cross section that does not include the first low oxygen concentration region 60 at least in a portion of the first layer 30 in its thickness direction.

In the high oxygen concentration region 70, oxygen is easily taken in as compared with the second low oxygen concentration region 80 because the high oxygen concentration region 70 grows with the inclined interfaces 30i as growth surfaces. Therefore, the oxygen concentration in the high oxygen concentration region 70 is higher than the oxygen concentration in the second low oxygen concentration region 80. The oxygen taken into the high oxygen concentration region 70 is, for example, oxygen that is unintentionally introduced into a HVPE apparatus, oxygen that is released from a member (quartz member or the like) constituting the HVPE apparatus, or the like.

The oxygen concentration in the high oxygen concentration region 70 is, for example, $9 \times 10^{17}$ cm$^{-3}$ or more and $5 \times 10^{19}$ cm$^{-3}$ or less.

The second layer 40 includes, for example, the high oxygen concentration region (inclined interface growth region) 70 and the second low oxygen concentration region (second c-plane growth region) 80 based on a difference in oxygen concentration.

An upper surface of the high oxygen concentration region 70 in the second layer 40 includes, for example, a plurality of valleys 70a and a plurality of mountains 70b in a cross-sectional view. Each of the valleys 70a and the mountains 70b referred to herein means a part of a shape that is observed based on a difference in light emission intensity when a cross section of the laminated structure 90 is observed using a fluorescence microscope or the like, and does not mean a part of the shape of an outermost surface generated during the growth of the second layer 40. As described above, the plurality of valleys 70a of the high oxygen concentration region 70 are formed at positions at which the c-plane 40c is generated again, in a cross-sectional view. Further, the plurality of valleys 70a of the high oxygen concentration region 70 are respectively formed above the plurality of mountains 60x of the first low oxygen concentration region 60. On the other hand, as described above, the plurality of mountains 70b of the high oxygen concentration region 70 are formed at positions at which the inclined interfaces 40i disappear and terminate, in a cross-sectional view. Further, the plurality of mountains 70b of the high oxygen concentration region 70 are respectively formed above the deep valleys 10dv of the base substrate 10, in the cross-sectional view.

Further, a surface of the second layer 40 that is substantially parallel to the main surface 10s of the base substrate 10 at an upper end of the high oxygen concentration region 70 is formed as a boundary surface 40b at a position at which the inclined interfaces 40i of the second layer 40 disappear and terminate.

The second low oxygen concentration region 80 is formed in a region that has grown with the c-plane 40c as a growth surface. Due to growing with the c-plane 40c as a growth surface, oxygen uptake is suppressed in the second low oxygen concentration region 80 as compared with the high oxygen concentration region 70. Therefore, the oxygen concentration in the second low oxygen concentration region 80 is lower than the oxygen concentration in the high oxygen concentration region 70.

The oxygen concentration in the second low oxygen concentration region 80 is, for example, $5 \times 10^{16}$ cm$^{-3}$ or less, preferably $3 \times 10^{16}$ cm$^{-3}$ or less.

In the present embodiment, in the growth process of the first layer 30, dislocations bend and propagate in a direction that is substantially perpendicular to the inclined interfaces 30i other than the c-plane at positions where the inclined interfaces 30i are exposed, and accordingly, in the second layer 40, some of the plurality of dislocations disappear and some of the plurality of dislocations are kept from propagating to the second surface 40s side of the c-plane expanded layer 42. Thereby, the dislocation density in the second surface 40s of the second layer 40 is lower than the dislocation density in the main surface 10s of the base substrate 10.

Further, in the present embodiment, the dislocation density in the second surface 40s of the second layer 40 is sharply reduced in the thickness direction.

Here, let $N_0$ be the dislocation density in the main surface 10s of the base substrate 10, and let N be a dislocation density in the boundary surface 40b at the position at which the inclined interfaces 40i disappear in the second layer 40. N represents an average dislocation density in the boundary surface 40b. On the other hand, let N' be a dislocation density in a surface of a crystal layer of a group III nitride semiconductor that is epitaxially grown on the main surface 10s of the base substrate 10 so as to have a thickness equal to the thickness from the main surface of the base substrate 10 to the boundary surface 40b of the present embodiment, with only the c-plane as a growth surface (hereinafter, such a case will also be referred to as "in the case of c-plane limited growth").

In the case of the c-plane limited growth, the dislocation density in the surface of the crystal layer tended to be inversely proportional to the thickness of the crystal layer. Specifically, in the case of the c-plane limited growth, when the thickness of the crystal layer is 1.5 mm, a dislocation density reduction rate $N'/N_0$ is about 0.6.

In contrast, in the present embodiment, a dislocation density reduction rate $N/N_0$ is smaller than, for example, the dislocation density reduction rate $N'/N_0$ of the case of the c-plane limited growth.

Specifically, in the present embodiment, the thickness from the main surface 10s of the base substrate 10 to the boundary surface 40b at the position where the inclined interfaces 40i in the second layer 40 disappear is, for example, 1.5 mm or less, preferably 1.2 mm or less. Further, in the present embodiment, the above-described dislocation density reduction rate $N/N_0$ is, for example, 0.3 or less, preferably 0.23 or less, and more preferably 0.15 or less.

In the present embodiment, a lower limit of the thickness from the main surface 10s of the base substrate 10 to the boundary surface 40b is not limited, because the thinner, the better. However, the thickness from the main surface 10s of the base substrate 10 to the boundary surface 40b is, for example, greater than 200 μm, when consideration is given to processes from the generation of the inclined interfaces 30i to the disappearance of the inclined interfaces 40i in the first step S200 and the second step S300.

Further, in the present embodiment, a lower limit of the dislocation density reduction rate is not limited, because the smaller, the better. However, the dislocation density reduction rate is, for example, 0.01 or more, since the thickness from the main surface 10s of the base substrate 10 to the boundary surface 40b is 1.5 mm or less.

In addition, in the present embodiment, the entire second surface 40s of the second layer 40 is composed of +c plane, and the first layer 30 and the second layer 40 each do not include a polarity reversal domain (inversion domain). In this respect, the laminated structure 90 of the present embodiment is different from a laminated structure that is formed by a so-called DEEP (Dislocation Elimination by the Epitaxial-growth with inverse-pyramidal Pits) method, that is, different from a laminated structure including the polarity reversal domain in a core located at the center of a pit.

(3) Nitride Semiconductor Substrate (Nitride Semiconductor Free-Standing Substrate, Nitride Crystal Substrate)

Figure 8:
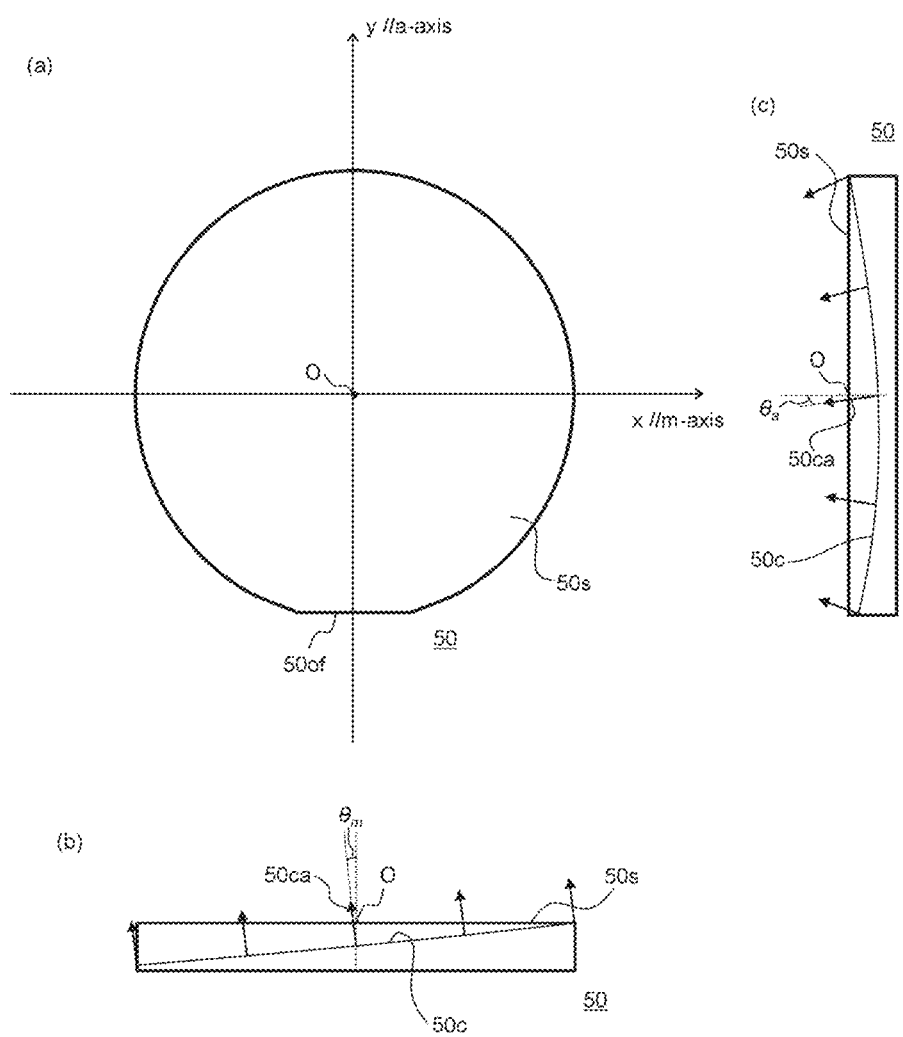
FIG. 8(a) is a schematic top view illustrating a nitride semiconductor substrate according to an embodiment of the present disclosure.
FIG. 8(b) is a schematic cross-sectional view taken along m-axis of the nitride semiconductor substrate according to the embodiment of the present disclosure.
FIG. 8(c) is a schematic cross-sectional view taken along a-axis of the nitride semiconductor substrate according to the embodiment of the present disclosure.

Next, the nitride semiconductor substrate 50 according to the present embodiment will be described with reference to FIG. 8. FIG. 8(a) is a schematic top view illustrating the nitride semiconductor substrate according to an embodiment of the present disclosure, FIG. 8(b) is a schematic cross-sectional view taken along the m-axis of the nitride semiconductor substrate according to the embodiment of the present disclosure, and FIG. 8(c) is a schematic cross-sectional view taken along the a-axis of the nitride semiconductor substrate according to the embodiment of the present disclosure.

In the present embodiment, the substrate 50 obtained by slicing the second layer 40 by the above-described manufacturing method is, for example, a free-standing substrate that is constituted by a single crystal of a group III nitride semiconductor. In the present embodiment, the substrate 50 is, for example, a GaN free-standing substrate.

The substrate 50 has a diameter of, for example, 2 inches or more. The substrate 50 has a thickness of, for example, 300 μm or more and 1 mm or less.

The conductivity of the substrate 50 is not particularly limited, but when manufacturing a semiconductor device as a vertical Schottky barrier diode (SBD) using the substrate 50, the substrate 50 is, for example, n-type, and n-type impurities in the substrate 50 are, for example, Si or germanium (Ge), and n-type impurities concentration in the substrate 50 is, for example, $1.0 \times 10^{18}$ cm$^{-3}$ or more and $1.0 \times 10^{20}$ cm$^{-3}$ or less.

The substrate 50 has, for example, the main surface 50s which is an epitaxial growth surface. In the present embodiment, a low index crystal plane that is closest to the main surface 50s is, for example, the c-plane 50c.

The main surface 50s of the substrate 50 is mirror-finished, for example, and a root mean square roughness RMS of the main surface 50s of the substrate 50 is, for example, less than 1 nm.

Further, in the present embodiment, the impurity concentration in the substrate 50 obtained by the above-described manufacturing method is lower than that of a substrate obtained by a flux method, an ammonothermal method, or the like.

Specifically, a hydrogen concentration in the substrate 50 is, for example, less than $1 \times 10^{17}$ cm$^{-3}$, preferably $5 \times 10^{16}$ cm$^{-3}$ or less.

Further, in the present embodiment, the substrate 50 is formed by slicing the main growth layer 44 grown with the c-plane 40c as a growth surface, and therefore does not include the high oxygen concentration region 70 grown with the inclined interfaces 30i or the inclined interfaces 40i as growth surfaces. That is, the entire substrate 50 is constituted by the second low oxygen concentration region 80.

Specifically, an oxygen concentration in the substrate 50 is, for example, $5 \times 10^{16}$ cm$^{-3}$ or less, preferably $3 \times 10^{16}$ cm$^{-3}$ or less.

Further, in the present embodiment, the substrate 50 does not include, for example, the polarity reversal domain (inversion domain) as described above.

Curvature of c-Plane and Variation in Off-Angle

As illustrated in FIGS. 8(b) and 8(c), in the present embodiment, the c-plane 50c, which is the low index crystal plane closest to the main surface 50s of the substrate 50, is curved in a concave spherical shape with respect to the main surface 50s, due to, for example, the above-described method for manufacturing the substrate 50.

In the present embodiment, the c-plane 50c of the substrate 50 has, for example, a curved surface that approximates to a spherical surface in each of a cross section taken along the m-axis and a cross section taken along the a-axis.

In the present embodiment, since the c-plane 50f of the substrate 50 is curved like a concave spherical surface as described above, at least a part of the c-axis 50ca is inclined with respect to the normal of the main surface 50s. The off-angle θ, which is the angle formed by the c-axis 50ca with respect to the normal of the main surface 50s, has a predetermined distribution within the main surface 50s.

In the off-angle θ formed by the c-axis 50ca with respect to the normal of the main surface 50s, a directional component extending along the m-axis is represented by $θ_m$, and a directional component extending along the a-axis is represented by $θ_a$, and $θ^2 = θ_m^2 + θ_a^2$ is satisfied.

In the present embodiment, since the c-plane 50c of the substrate 50 is curved like a concave spherical surface as described above, the off-angle m-axis component $θ_m$ and the off-angle a-axis component $θ_a$ can be approximately represented by a linear function of x and a linear function of y, respectively.

In the present embodiment, a radius of curvature of the c-plane 50c of the substrate 50 is larger than, for example, a radius of curvature of the c-plane 10c of the base substrate 10 used in the above-described method for manufacturing the substrate 50.

Specifically, the radius of curvature of the c-plane 50c of the substrate 50 is, for example, 23 m or more, preferably 30 m or more, and more preferably 40 m or more.

For reference, in the case of the c-plane limited growth, the radius of curvature of the c-plane of a substrate that is sliced from a crystal layer having the same thickness as a total thickness of the first layer 30 and the second layer 40 of the present embodiment may be larger than the radius of curvature of the c-plane 10c of the base substrate 10. However, in the case of the c-plane limited growth, when the thickness of the crystal layer is 2 mm, the radius of curvature of the c-plane of the substrate sliced from the crystal layer is about 11 m and is about 1.4 times the radius of curvature of the c-plane 10c of the base substrate 10.

In the present embodiment, an upper limit of the radius of curvature of the c-plane 50c of the substrate 50 is not particularly limited, because the larger, the better. When the c-plane 50c of the substrate 50 is substantially flat, the radius of curvature of the c-plane 50c can be considered infinite.

Further, in the present embodiment, since the radius of curvature of the c-plane 50c of the substrate 50 is large, the variation in the off-angle θ of the c-axis 50ca with respect to the normal of the main surface 50s of the substrate 50 can be smaller than the variation in the off-angle of the c-axis 10ca of the substrate 10.

Specifically, when an X-ray rocking curve of the (0002) plane of the substrate 50 is measured and the off-angle θ of the c-axis 50ca with respect to the normal of the main surface 50s is measured based on a diffraction peak angle of the (0002) plane, variation obtained as a difference between the largest off-angle θ and the smallest off-angle θ within a diameter of 29.6 mm from the center of the main surface 50s is, for example, 0.075° or less, preferably 0.057° or less, and more preferably 0.043° or less.

For reference, in the base substrate 10 prepared by the above-described VAS method, the variation in the off-angle of the c-axis 10ca determined by the above-described measurement method is about 0.22°. Further, in the case of the c-plane limited growth, when a nitride semiconductor substrate is obtained from a crystal layer that has the same thickness (for example, 2 mm) as the total thickness of the first layer 30 and the second layer 40 of the present embodiment, the variation in the off-angle of the c-axis of the nitride semiconductor substrate determined by the above-described measuring method is about 0.15°.

In the present embodiment, a lower limit of the variation in the off-angle θ of the c-axis 50ca of the substrate 50 is not particularly limited, because the smaller, the better. When the c-plane 50c of the substrate 50 is substantially flat, the variation in the off-angle θ of the c-axis 50ca of the substrate 50 can be considered 0°.

Further, in the present embodiment, since the curvature of the c-plane 50c becomes isotropically small with respect to the main surface 50s of the substrate 50, the radius of curvature of the c-plane 50c has little dependence on directions.

Specifically, a difference between a radius of curvature of the c-plane 50c in a direction extending along the a-axis and a radius of curvature of the c-plane 50c in a direction extending along the m-axis determined by the above-described measurement method is, for example, 50% or less, preferably 20% or less of the larger radius of curvature.

Dark Spots

Next, dark spots on the main surface 50s of the substrate 50 of the present embodiment will be described. The "dark spots" referred to herein means points at which the light emission intensity is low in an observation image of the main surface 50s observed using a multiphoton excitation microscope a cathode luminescence image of the main surface 50s, or the like, and includes not only dislocations but also non-light-emissive centers due to foreign matters or point defects. The "multiphoton excitation microscope" is sometimes referred to as a two-photon excitation fluorescence microscope.

In the present embodiment, since the substrate 50 is manufactured using the base substrate 10 constituted by a high-purity GaN single crystal prepared by the VAS method, there are few non-light-emissive centers due to foreign matters or point defects in the substrate 50. Accordingly, when the main surface of the substrate 50 is observed using a multiphoton excitation microscope or the like, 95% or more, preferably 99% or more of the dark spots are dislocations rather than non-light-emissive centers due to foreign matters or point defects.

Further, in the present embodiment, by the above-described manufacturing method, the dislocation density in the second surface 40s of the second layer 40 is lower than the dislocation density in the main surface 10s of the base substrate 10. Thereby, dislocations are also reduced in the main surface 50s of the substrate 50 formed by slicing the second layer 40.

Further, in the present embodiment, since three-dimensional growth of the first layer 30 is promoted due to the randomly roughened main surface 10s of the base substrate 10 by the above-described manufacturing method, regions that have high dislocation density due to concentration of dislocations are not formed, and regions having low dislocation density are uniformly formed in the main surface 50s of the substrate 50 formed by slicing the second layer 40.

Specifically, in the present embodiment, when a dislocation density is determined from a dark spot density by observing the main surface 50s of the substrate 50 using the multiphoton excitation microscope in a field of view of 250 µm square, there is no region that has a dislocation density higher than $3×10^6$ cm$^{-2}$, and regions having a dislocation density lower than $1×10^6$ cm$^{-2}$ constitute 80% or more, preferably 90% or more, and more preferably 95% or more of the main surface 50s. Even if there is a region that has a dislocation density of $1×10^6$ cm$^{-2}$ or more, the dislocation density of that region is $3×10^6$ cm$^{-2}$ or less.

In other words, in the present embodiment, a dislocation density determined by averaging the entire main surface 50s of the substrate 50 is, for example, less than $1×10^6$ cm$^{-2}$, preferably less than $5.5×10^5$ cm$^{-2}$, and more preferably $3×10^5$ cm$^{-2}$ or less.

In the case where the manufacturing method of the present embodiment is used, an upper limit of the ratio of regions that have a dislocation density lower than 1×10⁶ cm⁻² is, for example, 99% of the main surface 50s.

Further, the main surface 50s of the substrate 50 of the present embodiment includes, for example, dislocation-free regions of at least 50 µm square, for example, based on the average distance L between closest peaks in the first step S200 described above. Further, 50 µm square dislocation-free regions are scattered over the entire main surface 50s of the substrate 50, for example.

Further, the main surface 50s of the substrate 50 of the present embodiment includes, for example, 50 µm square dislocation-free regions that do not overlap each other at a density of 100 regions/cm² or more, preferably 800 regions/cm² or more, and more preferably 1600 regions/cm² or more. The case where the density of 50 µm square dislocation-free regions that do not overlap each other is 1600 regions/cm² or more corresponds to, for example, a case where the main surface 50s includes at least one 50 µm square dislocation-free region in an arbitrary field of view of 250 µm square. An upper limit of the density of 50 µm square dislocation-free regions that do not overlap each other is 40,000 regions/cm² due to the measurement method.

For reference, in the case of a substrate that is obtained by a conventional manufacturing method in which a special process for collecting dislocations is not performed, the size of dislocation-free regions is smaller than 50 µm square, or the density of 50 µm square dislocation-free regions is lower than 100 regions/cm².

Next, the Burgers vector of the dislocations in the substrate 50 of the present embodiment will be described.

In the present embodiment, since the dislocation density in the main surface 10s of the base substrate 10 used in the above-described manufacturing method is low, a plurality of dislocations are unlikely to be combined (mixed) when the first layer 30 and the second layer 40 are grown on the base substrate 10. This makes it possible to suppress the formation of dislocations having a large Burgers vector in the substrate 50 obtained from the second layer 40.

Specifically, in the substrate 50 of the present embodiment, for example, there are many dislocations whose Burgers vector is either <11-20>/3, <0001>, or <11-23>13. The "Burgers vector" referred to herein can be measured by, for example, a large-angle convergent-beam electron diffraction method (LACBED method) using a transmission electron microscope (TEM). Further, dislocations whose Burgers vector is <11-2043 are edge dislocations, dislocations whose Burgers vector is <0001> are screw dislocations, and dislocations whose Burgers vector is <11-2343 are mixed dislocations in which edge dislocations and screw dislocations are mixed.

In the present embodiment, when 100 dislocations on the main surface 50s of the substrate 50 are extracted at random, a percentage of dislocations whose Burgers vector is either <11-20>/3, <0001>, or <11-23>/3, is, for example, 50% or more, preferably 70% or more, and more preferably 90% or more. Dislocations whose Burgers vector is 2<11-20>/3, <11-20>, or the like may be present in at least a part of the main surface 50s of the substrate 50.

X-Ray Rocking Curve Measurement Performed by Varying Slit Width

Here, the inventor found that by measuring the X-ray rocking curve while varying the width of an incident side slit, both crystal quality factors of the substrate 50 of the present embodiment and the curvature (warp) of the c-plane 50c described above can be evaluated at the same time.

First, the influence of crystal quality factors on the X-ray rocking curve measurement will be described.

A full width at half maximum of a diffraction pattern in the X-ray rocking curve measurement is greatly affected by crystal quality factors such as high/low dislocation density, high/low mosaicity, high/low stacking fault density, high/low basal plane dislocation density, high/low point defect density (vacancy, etc.), large or small amount of in-plane fluctuation of lattice constant, and a distribution of an impurity concentration. When these crystal quality factors are not good, a fluctuation of a diffraction angle in the X-ray rocking curve measurement becomes large, and the full width at half maximum of the diffraction pattern becomes large.

Figure 9A:
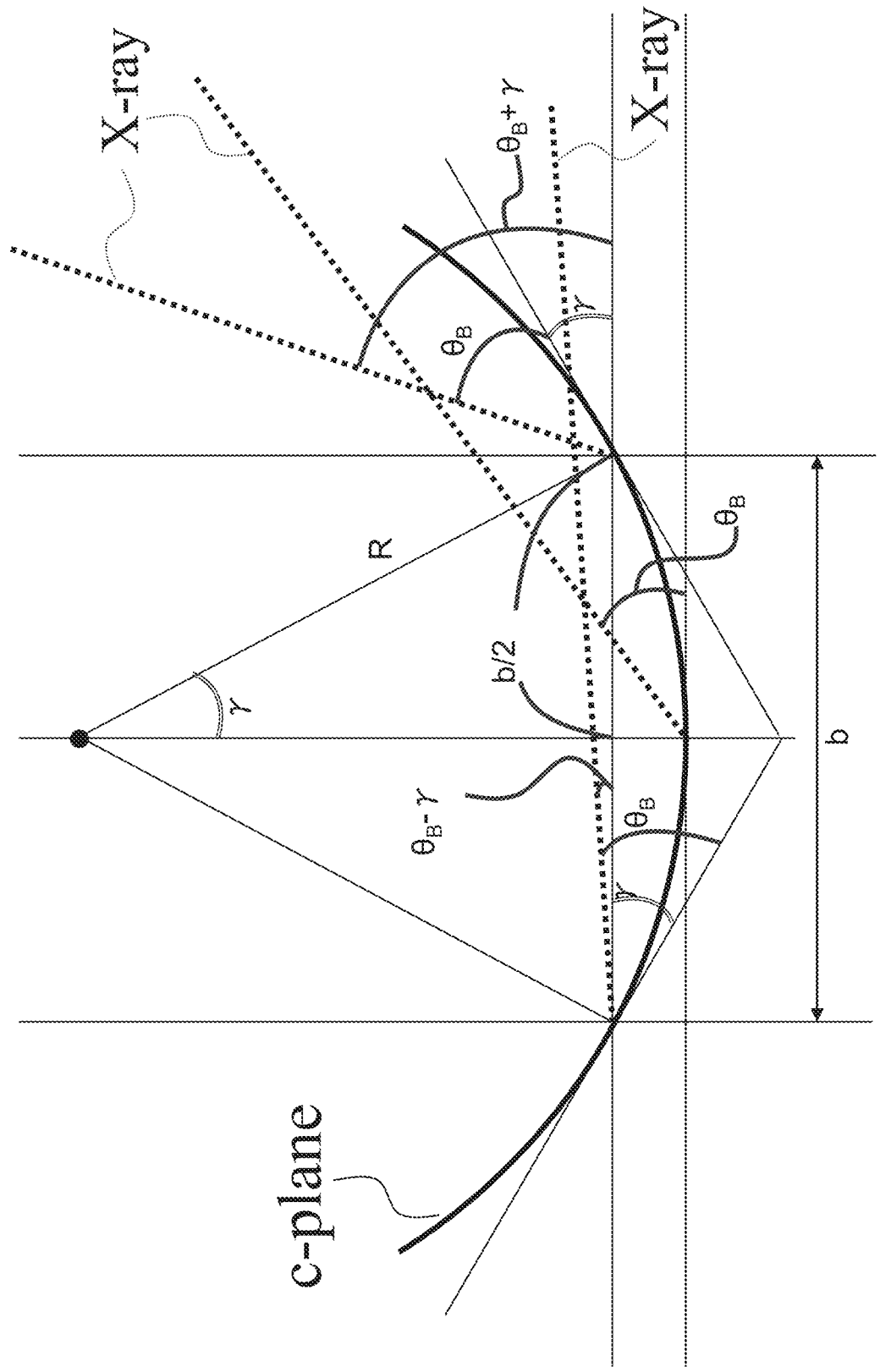
FIG. 9(a) is a schematic cross-sectional view illustrating X-ray diffraction with respect to a curved c-plane.

Next, the influence of the curvature of the c-plane 50c in the X-ray rocking curve measurement will be described with reference to FIG. 9(a). FIG. 9(a) is a schematic cross-sectional view illustrating diffraction of X-rays with respect to the curved c-plane.

An X-ray irradiation width b on the main surface of the substrate is calculated by the following formula (h), $$b = a/\sin \theta_B \tag{h}$$

wherein a represents the width of an X-ray incident side slit, b represents the X-ray irradiation width (footprint) by which the main surface of the substrate is irradiated with X-rays, and θB represents the Bragg angle of the crystal.

In a case where the c-plane of the substrate is curved, the radius of curvature R of the c-plane is very large relative to the X-ray irradiation width b as illustrated in FIG. 9(a) in which R represents the radius of curvature of the c-plane and γ represents half of the central angle formed by the curved c-plane within the range of the X-ray irradiation width b. Therefore, the angle γ can be calculated by the following formula (i).

$$\gamma = \sin^{-1}(b/2R) \approx b/2R \tag{i}$$

At this time, at the incident side end (right end in the figure) of the region on the c-plane of the substrate irradiated with X-rays, the diffraction angle with respect to the main surface of the substrate is $\theta_B + \gamma = \theta_B + b/2R$.

On the other hand, at the light receiving side end (left end in the figure) of the region on the c-plane of the substrate irradiated with X-rays, the diffraction angle with respect to the main surface of the substrate is $\theta_B - \gamma = \theta_B - b/2R$.

Accordingly, based on the difference between the diffraction angle with respect to the main surface of the substrate at the incident side end of the c-plane of the substrate and the diffraction angle with respect to the main surface of the substrate at the light receiving side end of the c-plane of the substrate, the fluctuation of the X-ray diffraction angle with respect to the curved c-plane is b/R.

Figure 9B:
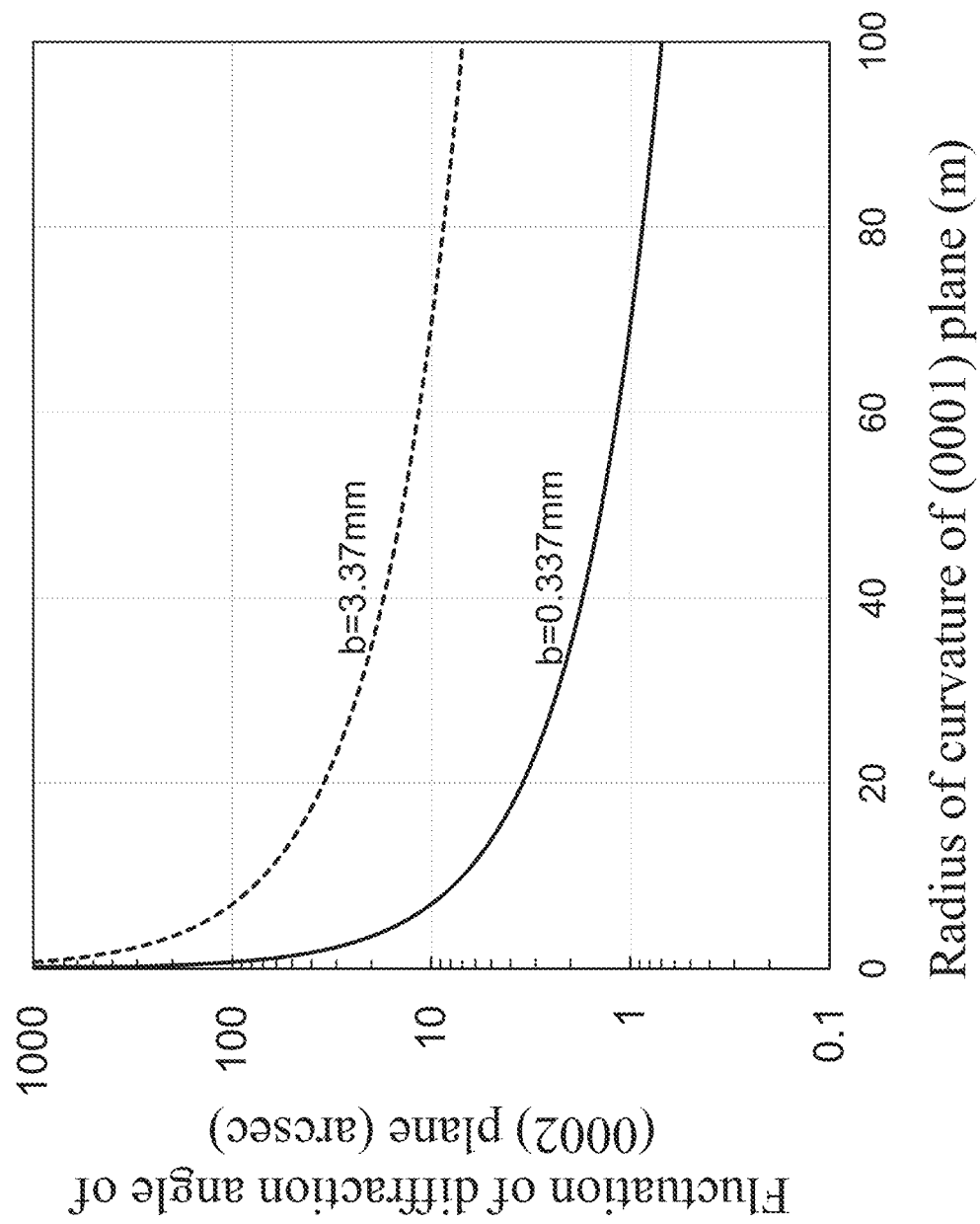
FIGS. 9(b) and 9(c) are views illustrating fluctuation of a diffraction angle of a (0002) plane with respect to a radius of curvature of the c-plane.
Figure 9C:
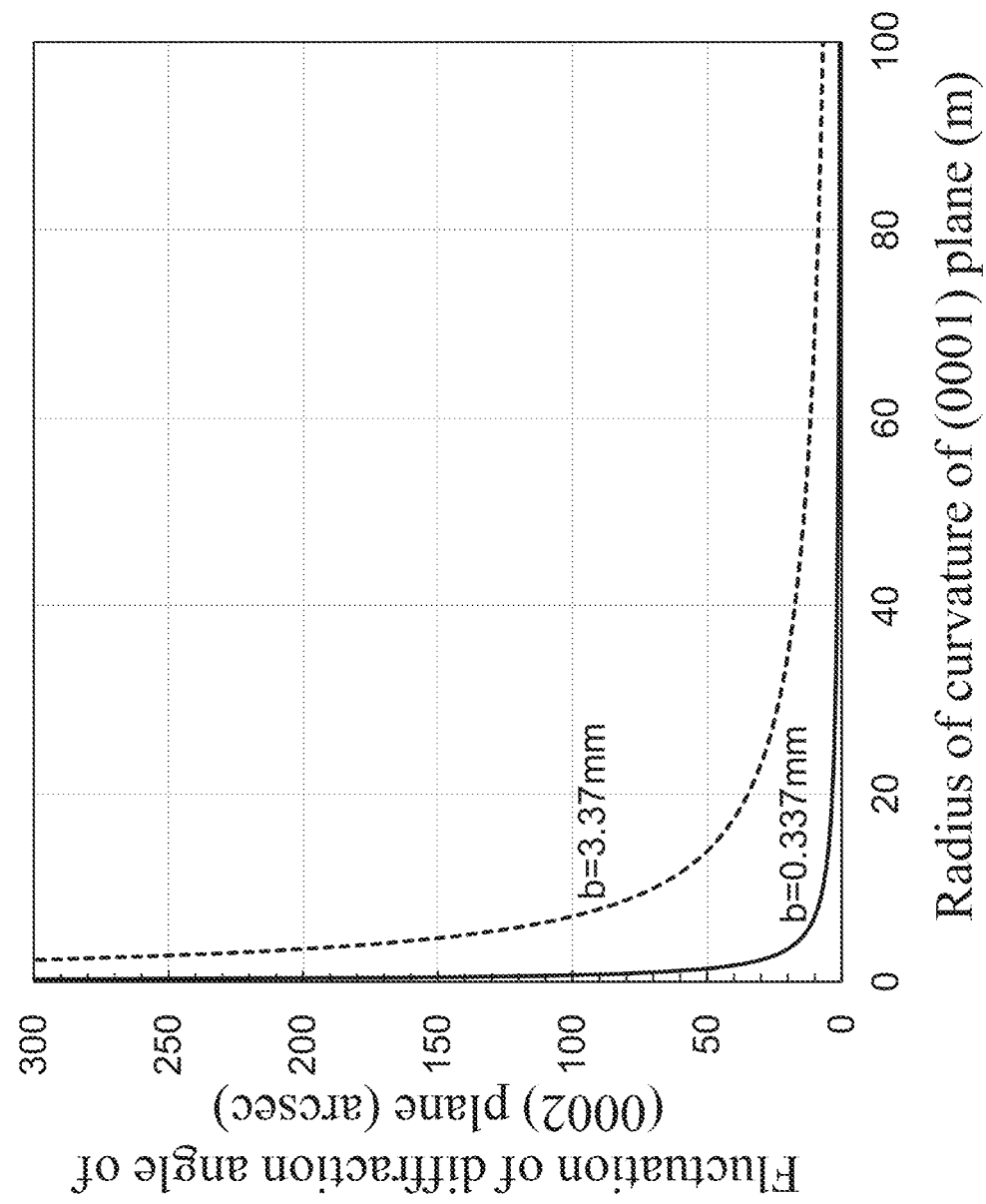

FIGS. 9(b) and 9(c) are diagrams illustrating the fluctuation of the diffraction angle of the (0002) plane relative to the radius of curvature of the c-plane. The vertical axis of FIG. 9(b) is a logarithmic scale, and the vertical axis of FIG. 9(c) is a linear scale.

As illustrated in FIGS. 9(b) and 9(c), when the width a of the X-ray incident side slit is increased, that is, when the X-ray irradiation width b is increased, fluctuation of the diffraction angle of the (0002) plane increases according to the X-ray irradiation width b. Also, as the radius of curvature R of the c-plane becomes smaller, the fluctuation of the diffraction angle of the (0002) plane gradually increases. The difference in the fluctuation of the diffraction angle of the (0002) plane between different X-ray irradiation widths b becomes larger as the radius of curvature R of the c-plane becomes smaller.

When the width a of the incident side slit is narrow, the influence of the curvature of the c-plane is small, and the influence of the above-described crystal quality factors becomes dominant in the fluctuation of the diffraction angle of the (0002) plane. However, when the width a of the incident side slit is wide, both the influence of the above-described crystal quality factors and the influence of the curvature of the c-plane are superimposed in the fluctuation of the diffraction angle of the (0002) plane. Accordingly, when the X-ray rocking curve measurement is performed while varying the width a of the incident side slit, both the above-described crystal quality factors and the curvature (warp) of the c-plane can be evaluated at the same time over the region irradiated with X-rays.

Here, features of the substrate 50 of the present embodiment when the X-ray rocking curve is measured will be described.

In the following, when an X-ray rocking curve of (0002) plane diffraction is measured by irradiating the main surface 50s of the substrate 50 with Cu Kα1 X-rays via a two-crystal monochromator of a Ge (220) plane and a slit, a full width at half maximum of the (0002) plane diffraction when the width of the slit in a ω direction is 1 mm is represented by "FWHMa", and a full width at half maximum of the (0002) plane diffraction when the width of the slit in the ω direction is 0.1 mm is represented by "FWHMb". The "ω direction" refers to a rotation direction when the substrate 50 is rotated about an axis that is parallel to the main surface of the substrate 50 and passes through the center of the substrate 50 in the X-ray rocking curve measurement.

In the substrate 50 of the present embodiment, all of the crystal quality factors such as high/low dislocation density, high/low mosaicity, high/low stacking fault density, high/low basal plane dislocation density, high/low point defect density (vacancy, etc.), large or small amount of in-plane fluctuation of lattice constant, and a distribution of an impurity concentration are good.

As a result, in the substrate 50 of the present embodiment, when the X-ray rocking curve measurement of the (0002) plane diffraction is performed by setting the width of the slit in the ω direction to 0.1 mm, the full width at half maximum FWHMb of the (0002) plane diffraction is, for example, 80 arcsec or less, preferably 50 arcsec or less, more preferably 38.5 arcsec or less, and further preferably 32 arcsec or less.

Further, in the substrate 50 of the present embodiment, all of the above-described crystal quality factors are good over a wide range of the main surface 50s.

As a result, when the X-ray rocking curve measurement of the (0002) plane diffraction is performed at a plurality of measurement points that are set at 5 mm intervals (between the center and the outer edge) within the main surface 50s of the substrate 50 of the present embodiment by setting the width of the slit in the ω direction to 0.1 mm, the full width at half maximum FWHMb of the (0002) plane diffraction is 80 arcsec or less, preferably 50 arcsec or less, more preferably 38.5 arcsec or less, and further preferably 32 arcsec or less, for example, at 90% or more of all the measurement points.

Further, in the substrate 50 of the present embodiment, in-plane variation of the above-described crystal quality factors is small. Therefore, a (0002) plane diffraction pattern obtained in the X-ray rocking curve measurement performed by setting the width of the incident side slit wide is unlikely to be narrower than a (0002) plane diffraction pattern obtained in the X-ray rocking curve measurement performed by setting the width of the incident side slit narrow.

As a result, in the substrate 50 of the present embodiment, the full width at half maximum FWHMa of the (0002) plane diffraction when the width of the slit in the ω direction is 1 mm can be, for example, larger than or equal to the full width at half maximum FWHMb of the (0002) plane diffraction when the width of the slit in the ω direction is 0.1 mm.

Even when the crystal quality factors of the substrate 50 are good, there is a case where FWHMa<FWHMb, with FWHMb being very small.

Further, in the substrate 50 of the present embodiment, as described above, not only there are few dislocations, but also all of the above-described crystal quality factors are good in a well-balanced manner over a wide range of the main surface 50s. Further, the curvature of the c-plane 50c of the substrate 50 is small, and the radius of curvature of the c-plane 50c is large. Due to the above-described crystal quality factors being good in a well-balanced manner across the region irradiated with X-rays and the radius of curvature of the c-plane being large in the substrate 50 of the present embodiment, fluctuation of the diffraction angle of the (0002) plane does not become large even when the X-ray rocking curve measurement is performed by setting the width of the incident side slit wide. Therefore, even when the X-ray rocking curve measurement is performed by varying the width of the incident side slit, a difference in the fluctuation of the diffraction angle of the (0002) plane is small.

As a result, at a predetermined measurement point (e.g., the center of the main surface) of the substrate 50 of the present embodiment, a difference FWHMa-FWHMb obtained by subtracting the full width at half maximum FWHMb of the (0002) plane diffraction when the width of the slit in the ω direction is 0.1 mm from the full width at half maximum FWHMa of the (0002) plane diffraction when the width of the slit in the ω direction is 1 mm is, for example, (0% or more and) 30% or less, preferably 22% or less of FWHMa.

Further, when the X-ray rocking curve measurement of the (0002) plane diffraction is performed at a plurality of measurement points set at 5 mm intervals (between the center and the outer edge) within the main surface 50s of the substrate 50 of the present embodiment by varying the width of the slit in the ω direction, FWHMa-FWHMb is, for example, 30% or less, preferably 22% or less of FWHMa, at 95% or more, preferably 100% of all the measurement points.

In the substrate 50 of the present embodiment, even when FWHMa <FWHMb, |FWHMa-FWHMb|/FWHMa is 30% or less.

Further, in the substrate 50 of the present embodiment, even when the X-ray rocking curve measurement is performed by setting the width of the incident side slit wide, variation of the above-described crystal quality factors is small across the region irradiated with X-rays, and therefore, the diffraction pattern has a single peak.

For reference, a substrate manufactured by a conventional manufacturing method (hereinafter, also referred to as a conventional substrate) will be described. The conventional manufacturing method referred to herein is, for example, a conventional VAS method, a method of growing a thick film using the c-plane as a growth surface, the above-described DEEP method, a THVPE (Tri-halide vapor phase epitaxy) method, an ammonothermal method, or a flux method.

In the conventional substrate, at least any of the above-described crystal quality factors is not good when compared with that of the substrate 50 of the present embodiment. Therefore, FWHMb in the conventional substrate is larger than that of the substrate 50 of the present embodiment.

In the conventional substrate, in-plane variation of at least any of the above-described crystal quality factors may occur. Therefore, a (0002) plane diffraction pattern obtained in the X-ray rocking curve measurement performed by setting the width of the incident side slit wide may be wider than a (0002) plane diffraction pattern obtained in the X-ray rocking curve measurement performed by setting the width of the incident side slit narrow. As a result, in the conventional substrate, FWHMa<FWHMb may be satisfied.

In the conventional substrate, the radius of curvature of the c-plane is smaller than that of the substrate 50 of the present embodiment. When the width of the slit is wide, at least a part of the region irradiated with X-rays necessarily includes a portion where at least any of the crystal quality factors is not good when compared with that of the substrate 50 of the present embodiment. Therefore, the difference FWHMa-FWHMb in the base substrate 10 becomes larger than that of the substrate 50 of the present embodiment.

In the conventional substrate, in-plane variation of at least any of the above-described crystal quality factors may occur. When the width of the slit is wide, fluctuation of the diffraction angle may vary in at least a part of the region irradiated with X-rays. Therefore, the diffraction pattern may have a plurality of peaks when the width of the slit is wide.

As described above, the conventional substrate may not satisfy the above-described conditions defined for the substrate 50 of the present embodiment.

(4) Effects Achieved by the Present Embodiment

According to the present embodiment, one or more of the following effects can be achieved.

(a) By etching the main surface 10s of the base substrate 10 to roughen the main surface 10s in the etching step S190, three-dimensional growth of the first layer 30 can be promoted in the first step S200 due to the roughened main surface 10s of the base substrate 10 to generate inclined interfaces 30i other than the c-plane at the first surface 30s of the first layer 30. By generating the inclined interfaces 30i other than the c-plane in the first surface 30s of the first layer 30, it is possible to bend dislocations and make the dislocations propagate in a direction substantially perpendicular to the inclined interfaces 30i at positions where the inclined interfaces 30i are exposed. Thus, the dislocations can be locally collected. As a result of the dislocations being locally collected, dislocations that have Burgers vectors opposite to each other disappear. Alternatively, as a result of the locally collected dislocations forming a loop, the dislocations can be kept from propagating to the second surface 40s side of the second layer 40. Thus, the dislocation density in the second surface 40s of the second layer 40 can be lowered. As a result, a substrate 50 having a lower dislocation density than the base substrate 10 can be obtained.

(b) As described above, since some of the plurality of dislocations disappear and some of the plurality of dislocations are kept from propagating to the second surface 40s side of the second layer 40 during the growth process of the second layer 40, the dislocation density can be lowered sharply and faster than in the case of the c-plane limited growth. That is, the dislocation density reduction rate $N/N_0$ in the present embodiment can be made smaller than the dislocation density reduction rate $N'/N_0$ of the case of the c-plane limited growth. As a result, the substrate 50 having a lower dislocation density than the base substrate 10 can be efficiently obtained, and its productivity can be improved.

(c) In the first step S200, the c-plane disappears from the first surface 30s of the first layer 30. As a result, the dislocations propagated from the base substrate 10 can be reliably bent at positions where the inclined interfaces 30i in the first layer 30 are exposed.

Here, a case where the c-plane remains in the first step will be considered. In this case, in portions where the c-plane remains, the dislocations propagated from the base substrate propagate substantially vertically upward without being bent and reach the second surface of the second layer. Therefore, the dislocations are not reduced and high dislocation density regions are formed above the portions where the c-plane remains.

In contrast, according to the present embodiment, since the c-plane disappears from the first surface 30s of the first layer 30 in the first step S200, the first surface 30s of the first layer 30 can be constituted only by the inclined interfaces 30i other than the c-plane, and the plurality of valleys 30v and the plurality of peaks 30t can be formed in the first surface 30s of the first layer 30. Thereby, the dislocations propagated from the base substrate 10 can be reliably bent over the entire first surface 30s of the first layer 30. Since the dislocations are reliably bent, some of the plurality of dislocations are likely to disappear, or some of the plurality of dislocations are unlikely to propagate to the second surface 40s side of the second layer 40. As a result, the dislocation density can be lowered over the entire main surface is of the substrate 50 obtained from the second layer 40.

(d) In the present embodiment, by roughening the main surface 10s of the base substrate 10 in the etching step S190, it is possible to cause immediate three-dimensional growth of the first layer 30.

Here, a case where the first step S200 is performed using a base substrate 10 that includes a mirror-finished main surface 10s without the etching step S190 is performed will be considered. In this case, the first layer 30 is grown on the mirror-finished main surface 10s at the beginning of the first step S200, and accordingly, the first layer 30 grows two-dimensionally for a certain period of time rather than immediately growing three-dimensionally. Therefore, generation of the inclined interfaces 30i other than the c-plane in the first surface 30s of the first layer 30 is delayed. As a result, the time it takes to obtain the first layer 30 from which the c-plane has disappeared may be long.

In contrast, in the present embodiment, the main surface 10s of the base substrate 10 is roughened in the etching step S190, and therefore, the first layer 30 can be three-dimensionally grown immediately after the etching step S190 without a flat surface constituted only by the c-plane being generated in the first layer 30. Thereby, it is possible to reduce the time it takes to obtain the first layer 30 from which the c-plane has disappeared.

As a result, manufacturing steps can be shortened when compared with the above-described case where the etching step S190 is not performed.

(e) In the present embodiment, spontaneous three-dimensional growth of the first layer 30 is promoted due to the roughened main surface 10s of the base substrate 10, and therefore, the first growth condition can satisfy the formula (1) even when the range of the first growth condition is increased. Specifically, the first growth condition, which is the growth temperature in the first step S200, the V/III ratio in the first step S200, or the like can be made substantially equal to the second growth condition in the second step S300. When the first growth condition is substantially equal to the second growth condition, a series of manufacturing steps can be carried out with ease. Also, the manufacturing steps can be shortened since the growth temperature, the V/III ratio, or the like need not be adjusted.

(f) In the present embodiment, since the first growth condition satisfies the formula (1) due to the roughened main surface 10s of the base substrate 10, {11-2m} planes satisfying m 3 can be generated as the inclined interfaces 30i in the first step S200. Thereby, an inclination angle of the {11-2m} plane with respect to the c-plane can be made moderate. Specifically, the inclination angle can be 47.3° or less. Since the inclination angle of the {11-2m} plane with respect to the c-plane is moderate, a cycle of the plurality of peaks 30t can be lengthened. Specifically, the average distance L between closest peaks can be greater than 100 μm when an arbitrary cross section perpendicular to the main surface 10s of the base substrate 10 is observed.

For reference, when an etch pit is generated in a nitride semiconductor substrate using a predetermined etchant, an etch pit that is constituted by a {1-10n} plane is usually formed in the surface of the substrate. In contrast, {11-2m} planes satisfying m 3 can be generated in the first surface 30s of the first layer 30 grown under a predetermined condition in the present embodiment. Accordingly, it is considered that the inclined interfaces 30i peculiar to the manufacturing method are formed in the present embodiment as compared with the usual etch pit.

(g) In the present embodiment, when an arbitrary cross section perpendicular to the main surface 10s of the base substrate 10 is observed, the average distance L between closest peaks is greater than 100 μm, and therefore, at least a distance longer than 50 μm can be secured for the dislocations to bend and propagate. Thereby, the dislocations can be sufficiently collected above substantially the center between each pair of peaks 30t of the first layer 30. As a result, the dislocation density in the second surface 40s of the second layer 40 can be sufficiently lowered.

(h) In the first step S200, after the first surface 30s of the first layer 30 from which the c-plane has disappeared due to the roughened main surface 10s of the base substrate 10 is obtained, the growth of the first layer 30 is continued over a predetermined thickness while a state where the first surface 30s is constituted only by the inclined interfaces 30i is maintained due to the roughened main surface 10s of the base substrate 10. Thereby, it is possible to make sure that the c-plane disappears over the entire first surface 30s of the first layer 30. For example, even if the c-plane partially remains in the recessed portion expanded layer 32, it is possible to make sure that the c-plane disappears.

Further, a sufficient time can be secured to bend the dislocations at positions where the inclined interfaces 30i are exposed, by continuing the growth of the first layer 30 at the inclined interfaces 30i after the c-plane disappears. Here, if the c-plane is grown immediately after disappearing, there is a possibility of the dislocations not being sufficiently bent and propagating in the substantially vertical direction toward the second surface of the second layer. In contrast, according to the present embodiment, since sufficient time is secured to bend the dislocations at positions where the inclined interfaces 30i other than the c-plane are exposed, particularly, dislocations near the peaks 30t of the first layer 30 can be reliably bent, and the dislocations can be kept from propagating in the substantially vertical direction from the base substrate 10 toward the second surface 40s of the second layer 40. Thereby, concentration of the dislocations above the peaks 30t of the first layer 30 can be suppressed.

(i) According to the manufacturing method of the present embodiment, the radius of curvature of the c-plane 50c of the substrate 50 can be made larger than the radius of curvature of the c-plane 10c of the base substrate 10. Thereby, the variation in the off-angle θ of the c-axis 50ca with respect to the normal of the main surface 50s of the substrate 50 can be made smaller than the variation in the off-angle of the c-axis 10ca of the base substrate 10.

For example, the following reasons are conceivable as reasons why the radius of curvature of the c-plane 50c of the substrate 50 can be made large.

As described above, in the first step S200, the high oxygen concentration region 70 is formed by three-dimensionally growing the first layer 30 with the inclined interfaces 30i other than the c-plane as growth surfaces. In the high oxygen concentration region 70, oxygen is easily taken in as compared with the first low oxygen concentration region 60. Therefore, the oxygen concentration in the high oxygen concentration region 70 is higher than the oxygen concentration in the first low oxygen concentration region 60.

By taking oxygen into the high oxygen concentration region 70 as described above, the lattice constant of the high oxygen concentration region 70 can be made larger than the lattice constant of regions other than the high oxygen concentration region 70 (reference: Chris G. Van de Walle, Physical Review B vol. 68, 165209 (2003)). Due to the curvature of the c-plane 10c of the base substrate 10, a stress that is concentrated toward the center of curvature of the c-plane is applied on the base substrate 10 or the first low oxygen concentration region 60 grown with the c-plane of the first layer 30 as a growth surface. In contrast, by making the lattice constant in the high oxygen concentration region 70 relatively large, a stress can be generated in the high oxygen concentration region 70 so as to spread the c-plane outward in a direction extending along the surface. Thereby, the stress concentrated toward the center of curvature of the c-plane on the lower side of the high oxygen concentration region 70 can be offset by the stress that causes the c-plane in the high oxygen concentration region 70 to spread outward in the direction extending along the surface.

Due to the stress offset effect of the first layer 30 described above, the radius of curvature of the c-plane 50c of the substrate 50 obtained from the second layer 40 can be made larger than the radius of curvature of the c-plane 10c of the base substrate 10 obtained by the conventional VAS method.

(j) In the substrate 50 obtained by the manufacturing method of the present embodiment, not only the dislocation density can be lowered and the variation in the off-angle can be reduced, but also all of the above-described crystal quality factors that determine the full width at half maximum in the X-ray rocking curve measurement can be made good in a well-balanced manner. Thereby, in the substrate 50 of the present embodiment, FWHMb can be 38.5 arcsec or less. Further, in the substrate 50 of the present embodiment, the radius of curvature of the c-plane is large and the above-described crystal quality factors are good in a well-balanced manner over the entire region irradiated with X-rays even when the slit width is 1 mm, and therefore, (FWHMa-FWHMb)/FWHMa can be 30% or less.

Other Embodiments

An embodiment of the present disclosure has been described. However, the present disclosure is not limited to the above-described embodiment, and various modifications can be made without departing from the gist thereof.

In the above-described embodiment, an explanation is given for the case where the base substrate 10 is a GaN free-standing substrate, but the base substrate 10 is not limited to the GaN free-standing substrate, and for example, may be a free-standing substrate constituted by a group III nitride semiconductor such as aluminum nitride (AlN), aluminum gallium nitride (AlGaN), indium nitride (InN), indium gallium nitride (InGaN), or aluminum indium gallium nitride (AlInGaN), that is, a free-standing substrate constituted by a group III nitride semiconductor represented by a composition formula of $Al_xIn_yGa_{1-x-y}N$ ($0 \leq x \leq 1$, $0 \leq y \leq 1$, $0 \leq x+y \leq 1$).

In the above-described embodiment, an explanation is given for the case where the substrate 50 is a GaN free-standing substrate, but the substrate 50 is not limited to the GaN free-standing substrate, and for example, may be a free-standing substrate constituted by a group III nitride semiconductor such as AlN, AlGaN, InN, InGaN, or AlInGaN, that is, a free-standing substrate constituted by a group III nitride semiconductor represented by a composition formula of $Al_xIn_yGa_{1-x-y}N$ ($0 \leq x \leq 1$, $0 \leq y \leq 1$, $0 \leq x+y \leq 1$).

In the above-described embodiment, an explanation is given for the case where the substrate 50 is n-type, but the substrate 50 may be p-type or may have semi-insulating properties. For example, when manufacturing a semiconductor device as a high electron mobility transistor (HEMT) using the substrate 50, the substrate 50 preferably has semi-insulating properties.

In the above-described embodiment, an explanation is given for the case where the main surface 10s of the base substrate 10 is mirror-finished in the polishing step S180 of the base substrate preparation step S100, but the present disclosure is not limited to such a case. The polishing step S180 may not be performed in the base substrate preparation step S100 because the main surface 10s of the base substrate 10 is roughened in the etching step S190. That is, a base substrate 10 (as-sliced substrate) that is sliced from the second crystal layer 6, which is an ingot, may be prepared in the base substrate preparation step S100. By omitting the polishing step S180 as described above, manufacturing steps can be shortened and the manufacturing cost can be reduced.

In the above-described embodiment, an explanation is given for the case where the first step S200 is successively performed after the etching step S190 in the same vapor phase growth apparatus, but the present disclosure is not limited to such a case. For example, Ga particles may be generated on the main surface 10s of the base substrate 10 after the etching step S190. In such a case, the base substrate 10 may be taken out of the vapor phase growth apparatus after the etching step S190, and a wet etching step may be performed before the first step S200 to remove the Ga particles generated on the main surface 10s of the base substrate 10 through wet etching. Hydrochloric acid is used as an etching solution, for example. In a case where gas etching is performed at a high temperature around 1050° C. in the etching step S190, non-crystalline GaN powder may also be generated on the main surface 10s of the base substrate 10. In such a case as well, a wet etching step similar to that described above may be performed.

In the above-described embodiment, the growth temperature and the V/III ratio are described as the first growth condition in the first step S200, but a growth condition other than the growth temperature and the V/III ratio may be adjusted, or the growth temperature, the V/III ratio, and another growth condition may be adjusted in combination, as the first growth condition so long as the first growth condition satisfies the formula (1). In these cases, the other growth condition serving as the first growth condition may be set to be substantially equal to the second growth condition or different from the second growth condition, depending on the objective.

In the above-described embodiment, the growth temperature and the V/III ratio are described as the second growth condition in the second step S300, but a growth condition other than the growth temperature and the V/III ratio may be adjusted, or the growth temperature, the V/III ratio, and another growth condition may be adjusted in combination, as the second growth condition so long as the second growth condition satisfies the formula (2).

In the above-described embodiment, an explanation is given for the case where the first growth condition is maintained in the inclined interface maintenance step S240 similarly to the recessed portion expansion step S220, but the growth condition in the inclined interface maintenance step S240 may be different from the growth condition in the recessed portion expansion step S220 so long as the growth condition in the inclined interface maintenance step S240 satisfies the formula (1). In this case, the growth condition in the inclined interface maintenance step S240 may be set so as to satisfy the formula (1) without only depending on the roughened main surface 10s of the base substrate 10.

In the above-described embodiment, an explanation is given for the case where the second growth condition is maintained in the main growth step S340 similarly to the c-plane expansion step S320, but the growth condition in the main growth step S340 may be different from the growth condition in the c-plane expansion step S320 so long as the growth condition in the main growth step S340 satisfies the formula (2).

In the above-described embodiment, an explanation is given for the case where the second crystal layer 6 or the main growth layer 44 is sliced using a wire saw in the slicing step S170 and the slicing step S400, but for example, an outer peripheral blade slicer, an inner peripheral blade slicer, an electric discharge machine, or the like may be used.

In the above-described embodiment, an explanation is given for the case where the substrate 50 is obtained by slicing the main growth layer 44 in the laminated structure 90, but the present disclosure is not limited thereto. For example, the laminated structure 90 may be used as is to manufacture a semiconductor laminate for manufacturing a semiconductor device. Specifically, after preparing the laminated structure 90, in the semiconductor laminate manufacturing step, a semiconductor functional layer is epitaxially grown on the laminated structure 90 to prepare a semiconductor laminate. After preparing the semiconductor laminate, a back surface side of the laminated structure 90 is polished to remove the base substrate 10, the first layer 30, and the c-plane expanded layer 42 from the laminated structure 90. Thereby, a semiconductor laminate that includes the main growth layer 44 and the semiconductor functional layer can be obtained as in the above-described embodiment. According to this case, the slicing step S400 and the polishing step S500 for obtaining the substrate 50 can be omitted.

In the above-described embodiment, an explanation is given for the case where the manufacturing steps are complete after the substrate 50 is manufactured, but the substrate 50 may be used as the base substrate 10, and steps S190 to S500 may be repeated. Thereby, a substrate 50 having a further lowered dislocation density can be obtained. Further, a substrate 50 with further reduced variation in the off-angle θ of the c-axis 50*ca* can be obtained. Further, the steps S190 to S500 performed using the substrate 50 as the base substrate 10 may be set as one cycle, and the cycle may be repeated a plurality of times. Thereby, the dislocation density of the substrate 50 can be gradually lowered according to the number of times the cycle is repeated. Further, the variation in the off-angle θ of the c-axis 50*ca* of the substrate 50 can be gradually reduced according to the number of times the cycle is repeated. In a case where the first layer 30 is three-dimensionally grown by adjusting the first growth condition without depending on the state of the second surface 40*s* of the second layer 40 below in the second and the following cycles, the etching step S190 may be omitted in the second and the following cycles.

EXAMPLES

Hereinafter, various experimental results supporting the effects of the present disclosure will be described. In the following, the "nitride semiconductor substrate" may be simply abbreviated as the "substrate".

(1) Experiment 1

(1-1) Preparation of Samples

The following samples 1 to 3 were prepared to confirm effects of the etching step.
[Conditions for Preparing Sample 1]
  Only the etching step was applied.
(Base Substrate)
  Material: GaN
  Manufacturing method: VAS method
  Diameter: 2 inches
  Thickness: 400 μm
  Low index crystal plane closest to the main surface: c-plane
  A pattern mask layer was not formed on the main surface.
(Etching Conditions)
  Apparatus: HVPE apparatus
  Partial pressure of HCl gas: 3 kPa
  Partial pressure of H$_2$ gas: 94 kPa
  Temperature: 1,060° C.
  Period: 30 minutes Conditions for Preparing Sample 2

The first layer was grown so as to have a thickness of 1.2 mm after the etching step.
(Base Substrate)
  The same as sample 1.
(Etching Conditions)
  The same as sample 1.
(First Layer)
  Material: GaN
  Growth method: HYPE method
  First growth condition:
  Partial pressure of GaCl gas: 6.3 kPa
  Partial pressure of NH$_3$ gas: 15 kPa
  Partial pressure of H$_2$ gas: 55 kPa
  Growth temperature: 1,050° C.
  Thickness of first layer: 1.2 mm Conditions for Preparing Sample 3

The first layer was grown so as to have a thickness of 2.4 mm after the etching step.
(Base Substrate)
  The same as sample 1.
(Etching Conditions)
  The same as sample 1.
(First Layer)
  The same as sample 2 except for the thickness.
  Thickness of first layer: 2.4 mm (1-2) Evaluation Surfaces of samples 1 to 3 were observed using a scanning electron microscope.

(1-3) Result

FIG. 10(*a*) is a diagram showing an observation image obtained by observing the surface of sample 1 of Experiment 1 using the scanning electron microscope, FIG. 10(*b*) is a diagram showing an observation image obtained by observing the surface of sample 2 of Experiment 1 using the scanning electron microscope, and FIG. 10(*c*) is a diagram showing an observation image obtained by observing the surface of sample 3 of Experiment 1 using the scanning electron microscope.

In sample 1 in which only the etching step was applied, it was confirmed that the main surface of the base substrate could be roughened as shown in FIG. 10(*a*). Further, in sample 1, the presence of shallow valleys linearly extending with relatively short lengths in a plan view and the presence of deep valleys linearly extending with relatively long lengths in the plan view were confirmed. Further, in sample 1, it was confirmed that a distance between two adjacent deep valleys that did not intersect was longer than a distance between two adjacent shallow valleys that did not intersect. An average distance between two adjacent deep valleys that did not intersect was about 70 μm.

In sample 2 in which the first layer was grown so as to have a thickness of 1.2 mm after the etching step, irregularities were observed in the first surface of the first layer as shown in FIG. 10(*b*). From this result, it was confirmed that the first layer could be three-dimensionally grown due to the roughened main surface of the base substrate. Further, in sample 2, the irregularities in the surface of sample 2 were larger than irregularities in the surface of sample 1 in a plan view. From this result, it was confirmed that some of the plurality of recessed portions gradually disappeared and the other recessed portions could be gradually expanded as the first layer was grown. Further, in sample 2, an average distance between closest peaks of the first layer was about 130 μm. From this result, it was confirmed that the average distance between closest peaks of the first layer could be made greater than 100 μm due to the roughened main surface of the base substrate.

In sample 3 in which the first layer was grown so as to have a thickness of 2.4 mm, irregularities were observed in the first surface of the first layer as shown in FIG. 10(*c*). From this result, it was confirmed that although the first layer was thicker than that in sample 2, the state where the first surface was constituted only by inclined interfaces could be maintained due to the roughened main surface of the base substrate. The irregularities in the surface of sample 3 were larger than the irregularities in the surface of sample 2. It is thought that some recessed portions disappeared and the other recessed portions were expanded during the growth process of the first layer of sample 3.

(2) Experiment 2

(2-1) Preparation of Nitride Semiconductor Substrate

Nitride semiconductor substrates of an example and a comparable example were prepared as follows.

Conditions for Preparing the Nitride Semiconductor Substrate of the Example (Base Substrate)
  Material: GaN
  Manufacturing method: VAS method
  Diameter: 2 inches
  Thickness: 400 μm
  Low index crystal plane closest to the main surface: c-plane
  A pattern mask layer was not formed on the main surface.
(Etching Conditions)
  The same as sample 1 of Experiment 1.
  Apparatus: HVPE apparatus
  Partial pressure of HCl gas: 3 kPa
  Partial pressure of $H_2$ gas: 94 kPa
  Temperature: 1,060° C.
  Period: 30 minutes
(First Layer)
  The same as sample 2 of Experiment 1 except that the thickness was adjusted as appropriate.
  Material: GaN
  Growth method: HVPE method
  First growth condition:
  Partial pressure of GaCl gas: 6.3 kPa
  Partial pressure of $NH_3$ gas: 15 kPa
  Partial pressure of $H_2$ gas: 55 kPa
  Growth temperature: 1,050° C.
(Second Layer)
  Material: GaN
  Growth method: HVPE method
  Second growth condition:
  Partial pressure of GaCl gas: 9.5 kPa
  Partial pressure of $NH_3$ gas: 15 kPa
  Partial pressure of $H_2$ gas: 55 kPa
  Growth temperature: 1,050° C.
  Thickness from the main surface of the base substrate to the second surface of the second layer: about 2 mm
(Slicing Condition)
  Thickness of the nitride semiconductor substrate: 400 μm
  Kerf loss: 200 μm
  Two nitride semiconductor substrates that slightly differed in processed states were prepared in sample 1.

Conditions for Preparing the Nitride Semiconductor Substrate of the Comparative Example (Base Substrate)
  The same as the example.
  The etching step was not performed.
(Crystal Layer)
  Material: GaN
  Growth method: HVPE method
  Second growth condition: The same as the second layer of the example.
  Partial pressure of GaCl gas: 9.5 kPa
  Partial pressure of $NH_3$ gas: 15 kPa
  Partial pressure of $H_2$ gas: 55 kPa
  Growth temperature: 1,050° C.
  Thickness from the main surface of the base substrate to the surface of the crystal layer: about 2 mm
(Slicing Condition)
  The same as sample 1.

(2-2) Evaluation

Observation Using Multiphoton Excitation Microscope

Main surfaces of the base substrate and the substrates of the example and the comparative example were observed using a multiphoton excitation microscope. At this time, the dislocation density was measured by measuring a dark spot density over the entire main surface for every 250 μm field of view. It was confirmed that all dark spots on these substrates were dislocations by performing the measurement while shifting a focus in the thickness direction. Further, at this time, the ratio of the number of regions (low dislocation density regions) having a dislocation density lower than $1 \times 10^6$ $cm^{-2}$ to the total number of measurement regions of 250 μm field of view was determined. As shown in the results described below, the "low dislocation density regions" referred to herein means regions having a dislocation density lower than an average dislocation density in the main surface of the crystal layer of the comparative example in which the crystal layer was grown without the first step being performed.

X-Ray Rocking Curve Measurement

The following two types of X-ray rocking curve measurement were performed for each of the base substrate and the substrates of the example and the comparative example.

For the X-ray rocking curve measurement, "X'Pert-PRO MRD" manufactured by Spectris was used, and "Hybrid monochromator" manufactured by the same company was used as the monochromator at the incident side. The hybrid monochromator includes an X-ray mirror and two crystals of the Ge (220) plane in this order from an X-ray light source side. In the measurement, first, X-rays emitted from the X-ray light source were made into parallel lights by the X-ray mirror. Thereby, the number of X-ray photons (i.e., X-ray intensity) to be used could be increased. Next, the parallel lights from the X-ray mirror were made into Cu Kα1 monochromatic lights by the two crystals of the Ge (220) plane. Next, the monochromatic lights from the two crystals of the Ge (220) plane were narrowed to a predetermined width through a slit and were then incident on the substrate. When a full width at half maximum is determined through simulation for a case where the rocking curve of the (0002) plane of a perfect crystal GaN is measured using the hybrid monochromator, the full width at half maximum is 25.7 arcsec. That is, this full width at half maximum is the theoretical measurement limit when measurement is performed using the above-described optical system.

In the measurement, X-rays that were incident on the substrate were parallel lights toward the substrate side in a cross section taken along the ω direction, but were not parallel lights in a cross section taken along a direction (direction of the rotation axis of the substrate) orthogonal to the ω direction. Therefore, the width of the X-rays in the ω direction was almost constant, but the width of the X-rays in the direction orthogonal to the ω direction increased while the X-rays traveled from the slit to the substrate. Accordingly, in the X-ray rocking curve measurement, the full width at half maximum of the X-rays diffracted at a predetermined crystal plane depends on the width of the incident side slit in the ω direction in which the X-rays were parallel lights.

On the other hand, the light receiving side was open. A window width of a detector on the light receiving side was 14.025 mm. In the above-described optical system, the goniometer radius was 420 mm, and therefore, fluctuation of the Bragg angle of ±0.95° could be measured.

X-Ray Rocking Curve Measurement 1

The X-ray rocking curve of the (0002) plane of each of the base substrate and the substrates of the example and the comparative example was measured by setting the width of the incident side slit in the ω direction to 0.1 mm. At this time, the measurement was performed at a plurality of measurement points that were set at 5 mm intervals in each of the m-axis direction and the a-axis direction orthogonal to the m-axis direction, in the main surface of each substrate. As a result of the measurement, the radius of curvature of the c-plane and the off-angle, which was the angle formed by the c-axis with respect to the normal of the main surface, were obtained based on the diffraction peak angle of the (0002) plane at each measurement point. Further, variation in the off-angle was calculated as a difference between the largest off-angle and the smallest off-angle within a diameter of 29.6 mm from the center of the main surface. Further, the full width at half maximum FWHMb of the (0002) plane diffraction when the width of the incident side slit in the ω direction was 0.1 mm was obtained at each measurement point.

X-Ray Rocking Curve Measurement 2

The X-ray rocking curve was measured for each of the base substrate and the substrate of the example by setting the width of the incident side slit in the ω direction to 1 mm. The measurement was performed at the center of the main surface of each substrate. As a result of the measurement, the full width at half maximum FWHMa of the (0002) plane diffraction when the width of the incident side slit in the ω direction was 1 mm was obtained. Further, the ratio of FWHMa-FWHMb to FWHMa was obtained at the center of the main surface of each substrate.

In the X-ray rocking curve measurements 1 and 2, when the X-rays are incident on the main surface of each substrate at a Bragg angle of 17.28° of the (0002) plane with respect to the main surface, the X-ray footprint is about 0.337 mm when the width of the slit in the ω direction is 0.1 mm, and the X-ray foot print is about 3.37 mm when the width of the slit in the ω direction is 1 mm.

(2-3) Result

The results are shown in Table 1.

TABLE 1

|  | Example | A | B |
|---|---|---|---|
| Average dislocation density ($cm^{-2}$) | $4.3 \times 10^5$ | $1.5 \times 10^6$ | $3.0 \times 10^6$ |
| C | 96 | 30 | 0 |
| Radius (m) of curvature of c-plane | 33.9~68.6 | 11.3 | 7.64 |
| D | 0.025~0.050 | 0.15 | 0.22 |
| FWHMb (arcsec) (within main surface) | 28.6~32.0 | 38.5~66.2 | 40.1~77.8 |
| (FWHMa − FWHMb)/ FWHMa (%) | 4.3~22.5 | — | 54.2~79.6 |

A = Comparative example
B = Base substrate
C = Ratio (%) of low dislocation density regions
D = Variation (°) in off-angle (within diameter of 29.6 mm)

As shown in Table 1, in the substrate of the example, average dislocation density in the main surface was significantly lowered as compared with those in the base substrate and the substrate of the comparative example, and was less than $5.5 \times 10^6$ $cm^{-2}$. When a crystal layer is grown to be thick as in the comparative example, the dislocation density in the substrate is lowered as compared with that in the base substrate, but the dislocation density in the substrate of the example was further lowered as compared with that in the comparative example.

Further, when the dislocation density of the substrate of the example is represented by N, the above-described dislocation density reduction rate $N/N_0$ was 0.14.

Further, the substrate of the example did not include a region having a dislocation density higher than $3 \times 10^6$ $cm^{-2}$. Further, in the substrate of the example, regions (low dislocation density regions) having a dislocation density lower than $1 \times 10^6$ $cm^{-2}$ constituted 90% or more of the main surface.

Figure 11:
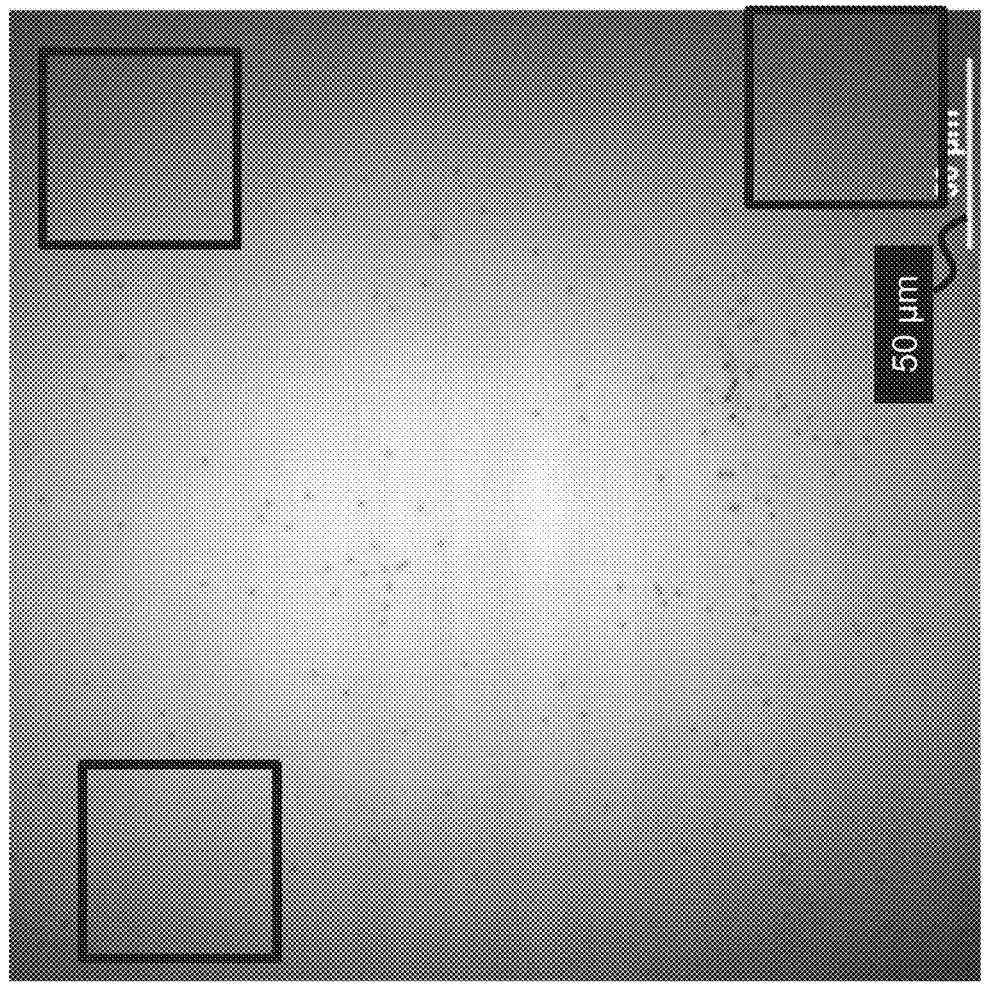
FIG. 11 shows a main surface of a nitride semiconductor substrate of an example observed using a multiphoton excitation microscope.

FIG. 11 shows the main surface of the nitride semiconductor substrate of the example observed using the multiphoton excitation microscope. As indicated by rectangular frames in FIG. 11, the main surface of the substrate of the example included dislocation-free regions of at least 50 μm square. Further, in the substrate of the example, 50 μm square dislocation-free regions were scattered over the entire main surface. The main surface of the substrate of the example included 50 μm square dislocation-free regions that did not overlap each other at a density of about 2400 regions/$cm^2$.

Further, as shown in Table 1, in the substrate of the example, the radius of curvature of the c-plane was larger than those of the base substrate and the substrate of the comparative example, and was 22 m or more. Further, in the substrate of the example, variation in the off-angle of the c-axis within the diameter of 29.6 mm was smaller than those in the base substrate and the substrate of the comparative example, and was no greater than 0.075°. When a crystal layer is grown to be thick as in the comparative example, variation in the off-angle of the c-axis in the substrate is reduced as compared with that in the base substrate, but the variation in the off-angle of the c-axis of the substrate of the example was further reduced as compared with that in the comparative example.

Further, as shown in Table 1, in the substrate of the example, the full width at half maximum FWHMb of (0002) plane diffraction when the width of the slit in the ω direction was 0.1 mm was 32 arcsec or less at all (i.e., 100%) of the measurement points.

Further, as shown in Table 1, in the substrate of the example, FWHMa-FWHMb was 0% or more and 30% or less of FWHMa. For reference, in the base substrate, FWHMa-FWHMb was 50% or more of FWHMa.

In the example described above, in the first step, the first growth condition could satisfy the formula (1) due to the roughened main surface of the base substrate. Thereby, three-dimensional growth of the first layer could be promoted and inclined interfaces other than the c-plane could be generated at the first surface of the first layer. By generating the inclined interfaces other than the c-plane at the first surface of the first layer, dislocations could be reliably bent at positions where the inclined interfaces in the first layer were exposed. It was confirmed that as a result, the dislocation density in the main surface of the substrate could be efficiently lowered.

Further, in the example, since the first growth condition satisfied the formula (1) due to the roughened main surface of the base substrate, the average distance between closest peaks was greater than 100 μm as shown in Experiment 1.

It was confirmed that as a result, the dislocation density in the main surface of the nitride semiconductor substrate could be sufficiently lowered. Also, it was confirmed that since the average distance between closest peaks was greater than 100 µm, dislocation-free regions of at least 50 µm square could be formed.

Further, it was confirmed that in the example, the radius of curvature of the c-plane of the substrate could be made larger than the radius of curvature of the c-plane of the base substrate, and variation in the off-angle of the c-axis of the nitride semiconductor substrate could be made smaller than variation in the off-angle of the c-axis of the base substrate.

Further, in the example, there were few dislocations and all crystal quality factors of the substrate were good in a well-balanced manner over a wide range of the main surface of the substrate as described above. It was confirmed that as a result, FWHMb was 32 arcsec or less over a wide range of the main surface of the substrate of the example.

Further, in the example, all crystal quality factors were good in a well-balanced manner and the radius of curvature of the c-plane of the substrate was large as described above. It was confirmed that as a result of these, when the X-ray rocking curve measurement was performed by varying the width of the incident side slit, the difference FWHMa-FWHMb in full width at half maximum was 30% or less of FWHMa.

Preferable Aspects of the Present Disclosure

Hereinafter, preferable aspects of the present disclosure will be supplementary described.

Supplementary Note 1

A method for manufacturing a nitride semiconductor substrate by using a vapor phase growth method, including:
  a step of preparing a base substrate that is constituted by a single crystal of a group III nitride semiconductor and in which a low index crystal plane closest to a main surface is a (0001) plane;
  an etching step of etching the main surface of the base substrate to roughen the main surface;
  a first step of growing a first layer by epitaxially growing a single crystal of a group III nitride semiconductor on the main surface of the base substrate, a plurality of recessed portions formed by inclined interfaces other than the (0001) plane being generated in a surface of the single crystal due to the roughened main surface of the base substrate, and at least some of the plurality of recessed portions being gradually expanded toward an upper side of the main surface of the base substrate, the first layer including a first surface from which the (0001) plane has disappeared and that is constituted only by the inclined interfaces; and
  a second step of growing a second layer including a mirror second surface by epitaxially growing a single crystal of a group III nitride semiconductor on the first layer so as to make the inclined interfaces disappear.

Supplementary Note 2

The method for manufacturing a nitride semiconductor substrate according to Supplementary Note 1,
  wherein, in the etching step, in situ etching is performed on the main surface of the base substrate in a vapor phase growth apparatus by supplying a predetermined etching gas to the main surface of the base substrate, and
  in the first step, the first layer is grown using the vapor phase growth apparatus in a state where the base substrate of which the surface has been roughened is placed in the vapor phase growth apparatus.

Supplementary Note 3

The method for manufacturing a nitride semiconductor substrate according to Supplementary Note 1 or 2,
  wherein, in the etching step, a plurality of deep valleys that are relatively deep and a plurality of shallow valleys that are relatively shallow are formed in the main surface of the base substrate, and
  in the first step, a plurality of valleys and a plurality of peaks are formed in the first surface of the first layer by making some of the plurality of recessed portions gradually disappear above the plurality of shallow valleys and by gradually expanding the other recessed portions above the plurality of deep valleys toward the upper side of the main surface of the base substrate.

Supplementary Note 4

The method for manufacturing a nitride semiconductor substrate according to Supplementary Note 3,
  wherein, in the first step, when an arbitrary cross section perpendicular to the main surface is observed, an average distance between a pair of peaks spaced apart from each other in a direction extending along the main surface is greater than 100 µm, the pair of peaks being closest to each other among the plurality of peaks with one of the plurality of valleys sandwiched therebetween.

Supplementary Note 5

The method for manufacturing a nitride semiconductor substrate according to Supplementary Note 4,
  wherein, in the first step, the average distance between the pair of peaks closest to each other is less than 800 µm.

Supplementary Note 6

The method for manufacturing a nitride semiconductor substrate according to any one of Supplementary Notes 3 to 5,
  wherein, in the etching step, in a direction extending along the main surface of the base substrate, a length by which each of the plurality of deep valleys linearly extends is made longer than a length by which each of the plurality of shallow valleys linearly extends.

Supplementary Note 7

The method for manufacturing a nitride semiconductor substrate according to any one of Supplementary Notes 3 to 6, wherein, in the etching step, in a direction extending along the main surface of the base substrate, a distance between two deep valleys that do not intersect and are adjacent to each other among the plurality of deep valleys is made longer than a distance between two shallow valleys that do not intersect and are adjacent to each other among the plurality of shallow valleys.

Supplementary Note 8

The method for manufacturing a nitride semiconductor substrate according to Supplementary Note 7, wherein, in the etching step, in a direction extending along the main surface of the base substrate, an average distance between two deep valleys that do not intersect and are adjacent to each other among the plurality of deep valleys is greater than 50 µm.

Supplementary Note 9

The method for manufacturing a nitride semiconductor substrate according to any one of Supplementary Notes 1 to 8,
  wherein, in the etching step, a surface roughness PV that is represented by a peak-to-valley value of the main surface of the base substrate is 5 µm or more and 100 µm or less.

Supplementary Note 10

The method for manufacturing a nitride semiconductor substrate according to any one of Supplementary Notes 1 to 9,
wherein, in the etching step, the (0001) plane disappears from the main surface of the base substrate.

Supplementary Note 11

The method for manufacturing a nitride semiconductor substrate according to any one of Supplementary Notes 1 to 10,
in the step of preparing the base substrate, the base substrate including the main surface that is mirror-finished is prepared.

Supplementary Note 12

The method for manufacturing a nitride semiconductor substrate according to any one of Supplementary Notes 1 to 10,
wherein, in the step of preparing the base substrate, the base substrate that is sliced from a predetermined ingot is prepared as is.

Supplementary Note 13

The method for manufacturing a nitride semiconductor substrate according to any one of Supplementary Notes 1 to 12,
wherein, in the first step, after the first surface from which the (0001) plane has disappeared is obtained, growth of the first layer is continued over a predetermined thickness while a state where the first surface is constituted only by the inclined interfaces is maintained.

Supplementary Note 14

The method for manufacturing a nitride semiconductor substrate according to any one of Supplementary Notes 1 to 13, further including
a step of slicing at least one nitride semiconductor substrate from the second layer after the second step.

Supplementary Note 15

The method for manufacturing a nitride semiconductor substrate according to Supplementary Note 14,
wherein, in the step of preparing the base substrate, the base substrate of which the (0001) plane is curved in a concave spherical shape with respect to the main surface is prepared, and
after the second step, variation in an off-angle that is formed by a <0001> axis with respect to a normal of a main surface of the nitride semiconductor substrate is made smaller than variation in an off-angle that is formed by the <0001> axis with respect to a normal of the main surface of the base substrate.

Supplementary Note 16

The method for manufacturing a nitride semiconductor substrate according to any one of Supplementary Notes 1 to 15,
wherein, in the first step,
a first low oxygen concentration region that has a relatively low oxygen concentration as compared with another region of the first layer is formed in a region of the first layer that grows while some of the plurality of recessed portions disappear,
a raised portion is formed above a portion of the first low oxygen concentration region from which some of the plurality of recessed portions have disappeared, and a pair of inclined portions are formed on opposite sides of the raised portion of the first low oxygen concentration region as loci of other recessed portions that are gradually expanded, and
an angle formed by the pair of inclined portions is 70° or less.

Supplementary Note 17

The method for manufacturing a nitride semiconductor substrate according to any one of Supplementary Notes 1 to 16,
wherein, in the first step, {11-2m} planes that satisfy m 3 are generated as the inclined interfaces.

Supplementary Note 18

The method for manufacturing a nitride semiconductor substrate according to any one of Supplementary Notes 1 to 17,
wherein, in the first step, the first layer is grown under a first growth condition that satisfies formula (1), and
in the second step, the second layer is grown under a second growth condition that satisfies formula (2), $$G_{c1} > G_i / \cos \alpha \quad (1)$$

$$G_{c2} < G_i / \cos \alpha \quad (2)$$

wherein $G_{c1}$ represents a growth rate of the (0001) plane in the first layer, $G_{c2}$ represents a growth rate of the (0001) plane in the second layer, $G_i$ represents a growth rate of an inclined interface in each of the first layer and the second layer, the inclined interface being the most inclined with respect to the (0001) plane among the inclined interfaces, and a represents an angle formed by the (0001) plane and the inclined interface most inclined with respect to the (0001) plane in each of the first layer and the second layer.

Supplementary Note 19

The method for manufacturing a nitride semiconductor substrate according to Supplementary Note 18,
wherein, in the first step, the first growth condition satisfies the formula (1) due to the roughened main surface of the base substrate.

Supplementary Note 20

A nitride semiconductor substrate that has a diameter of 2 inches or more and includes a main surface for which the closest low index crystal plane is a (0001) plane,
wherein, when an X-ray rocking curve of (0002) plane diffraction is measured by irradiating the main surface with Cu Kα1 X-rays via a two-crystal monochromator of a Ge (220) plane and a slit,
a difference FWHMa-FWHMb obtained by subtracting FWHMb from FWHMa is 30% or less of FWHMa,
FWHMa being a full width at half maximum of the (0002) plane diffraction when a width of the slit in a ω direction is 1 mm, and
FWHMb being a full width at half maximum of the (0002) plane diffraction when the width of the slit in the ω direction is 0.1 mm.

Supplementary Note 21

The nitride semiconductor substrate according to Supplementary Note 20,
wherein, when the X-ray rocking curve of (0002) plane diffraction is measured at a plurality of measurement points set at 5 mm intervals in the main surface, by setting the width of the slit in the ω direction to 0.1 mm, the full width at half maximum FWHMb of the (0002) plane diffraction is 80 arcsec or less at 90% or more of all the measurement points.

Supplementary Note 22

The nitride semiconductor substrate according to Supplementary Note 20 or 21,
wherein, when a dislocation density is determined from a dark spot density by observing the main surface using a multiphoton excitation microscope in a field of view of 250 μm square, the main surface does not include a region that has a dislocation density higher than $3\times10^6$ cm$^{-2}$, and regions having a dislocation density lower than $1\times10^6$ cm$^{-2}$ constitute 80% or more of the main surface.

Supplementary Note 23

A nitride semiconductor substrate that has a diameter of 2 inches or more,
wherein, when a dislocation density is determined from a dark spot density by observing a main surface of the nitride semiconductor substrate using a multiphoton excitation microscope in a field of view of 250 μm square, the main surface does not include a region that has a dislocation density higher than $3\times10^6$ cm$^{-2}$, and regions having a dislocation density lower than $1\times10^6$ cm$^{-2}$ constitute 80% or more of the main surface.

Supplementary Note 24

The nitride semiconductor substrate according to any one of Supplementary Notes 20 to 23,
wherein the main surface includes a dislocation-free region of at least 50 μm square.

Supplementary Note 25

The nitride semiconductor substrate according to any one of Supplementary Notes 20 to 24,
wherein the main surface includes dislocation-free regions of 50 μm square that do not overlap each other at a density of 100 regions/cm² or more.

Supplementary Note 26

A laminated structure including:
a base substrate that is constituted by a single crystal of a group III nitride semiconductor, has a roughened main surface, and in which a low index crystal plane that is closest to an imaginary plane obtained by averaging the main surface is a (0001) plane;
a first low oxygen concentration region that is provided on the main surface of the base substrate and is constituted by a single crystal of a group III nitride semiconductor;
a high oxygen concentration region that is provided on the first low oxygen concentration region and is constituted by a single crystal of a group III nitride semiconductor; and
a second low oxygen concentration region that is provided on the high oxygen concentration region and is constituted by a single crystal of a group III nitride semiconductor,
wherein an oxygen concentration in the high oxygen concentration region is higher than an oxygen concentration in the first low oxygen concentration region and an oxygen concentration in the second low oxygen concentration region, and
when an arbitrary cross section that is perpendicular to the main surface is observed,
an upper surface of the first low oxygen concentration region includes a plurality of valleys and a plurality of mountains, and
an average distance between a pair of mountains spaced apart from each other in a direction extending along the main surface is greater than 100 μm, the pair of mountains being closest to each other among the plurality of mountains with one of the plurality of valleys sandwiched therebetween.

Supplementary Note 27

The laminated structure according to Supplementary Note 26,
wherein the high oxygen concentration region is provided continuously along the main surface of the base substrate.

Supplementary Note 28

The laminated structure according to Supplementary Note 26 or 27,
wherein the first low oxygen concentration region includes pairs of inclined portions provided on opposite sides of the mountains, and
an angle formed by each pair of inclined portions is 70° or less.

Supplementary Note 29

The laminated structure according to any one of Supplementary Notes 26 to 28,
wherein when $N_0$ represents a dislocation density in the main surface of the base substrate and N represents a dislocation density in a boundary surface that extends along the main surface at an upper end of the high oxygen concentration region, a dislocation density reduction rate $N/N_0$ is smaller than a dislocation density reduction rate $N'/N_0$ where $N'$ represents a dislocation density in a surface of a crystal layer of a group III nitride semiconductor of a case where the crystal layer is epitaxially grown on the main surface of the base substrate so as to have a thickness equal to a thickness from the main surface of the base substrate to the boundary surface, with only the (0001) plane as a growth surface.

Supplementary Note 30

The laminated structure according to any one of Supplementary Notes 26 to 29,
wherein a thickness from the main surface of the base substrate to a boundary surface that extends along the main surface at an upper end of the high oxygen concentration region is 1.5 mm or less, and
when $N_0$ represents a dislocation density in the main surface of the base substrate and N represents a dislocation density in the boundary surface, a dislocation density reduction rate $N/N_0$ is 0.3 or less.

REFERENCE SIGNS LIST

10 Base substrate
30 First layer
40 Second layer
50 Nitride semiconductor substrate (substrate)

The invention claimed is:

1. A method for manufacturing a nitride semiconductor substrate, the method comprising:
a step of preparing a base substrate that is a first single crystal of a first group III nitride semiconductor and in which a low index crystal plane closest to a main surface is a (0001) plane;
an etching step of etching the main surface of the base substrate to roughen the main surface and to generate a plurality of first recessed portions in the main surface;
a first step of vapor phase growing a first layer by epitaxially growing a second single crystal of a second group III nitride semiconductor on the main surface of the base substrate, a plurality of second recessed portions formed by inclined interfaces other than the (0001) plane being generated in a surface of the second single crystal due to the roughened main surface of the base substrate, and at least some of the plurality of second recessed portions being gradually expanded toward an upper side of the main surface of the base substrate by adjusting a crystal growth condition and a number of the second recessed portions in the second single crystal being reduced to be less than a number of the first recessed portions in the base substrate by expanding the second recessed portions, the first layer including a first surface from which the (0001) plane has disappeared and that is constituted only by the inclined interfaces;

a second step of vapor phase growing a second layer including a mirror second surface by epitaxially growing a third single crystal of a third group III nitride semiconductor on the first layer so as to make the inclined interfaces disappear, and a step of slicing at least one substrate as the nitride semiconductor substrate from the second layer after the second step, wherein the base substrate, the first layer and the second layer do not include an inversion domain.

2. The method for manufacturing a nitride semiconductor substrate according to claim 1, wherein, in the etching step, in situ etching is performed on the main surface of the base substrate in a vapor phase growth apparatus by supplying a predetermined etching gas to the main surface of the base substrate, and in the first step, the first layer is grown using the vapor phase growth apparatus while the base substrate of which the surface has been roughened is placed in the vapor phase growth apparatus.

3. The method for manufacturing a nitride semiconductor substrate according to claim 1, wherein etching step comprises forming in the main surface of the base substrate a plurality of first valleys and a plurality of second valleys deeper than the plurality of first valleys, and in the first step, a plurality of third valleys and a plurality of peaks are formed in the first surface of the first layer by making some of the plurality of second recessed portions gradually disappear above the plurality of first valleys and by gradually expanding the other second recessed portions above the plurality of second valleys as growing the first layer toward the upper side of the main surface of the base substrate.

4. The method for manufacturing a nitride semiconductor substrate according to claim 3, wherein, in the first step, when an arbitrary cross section perpendicular to the main surface is observed, an average distance between a pair of peaks spaced apart from each other in a direction extending along the main surface is greater than 100 µm, the pair of peaks being closest to each other among the plurality of peaks with one of the plurality of third valleys sandwiched therebetween.

5. The method for manufacturing a nitride semiconductor substrate according to claim 4, wherein, in the first step, the average distance between the pair of peaks closest to each other is less than 800 µm.

6. The method for manufacturing a nitride semiconductor substrate according to claim 4, wherein, in the step of slicing the nitride semiconductor substrate, the nitride semiconductor substrate having a main surface including 50 µm square dislocation-free regions that do not overlap each other at a density of 100 regions/cm$^2$, is obtained.

7. The method for manufacturing a nitride semiconductor substrate according to claim 1, wherein, in the etching step, a surface roughness PV that is represented by a peak-to-valley value of the main surface of the base substrate is 5 µm or more and 100 µm or less.

8. The method for manufacturing a nitride semiconductor substrate according to claim 1, wherein, in the first step, after the first surface from which the (0001) plane has disappeared is obtained, growth of the first layer is continued over a predetermined thickness while a state where the first surface is constituted only by the inclined interfaces is maintained.

9. The method for manufacturing a nitride semiconductor substrate according to claim 1, wherein, in the step of preparing the base substrate, the base substrate of which the (0001) plane is curved in a concave spherical shape with respect to the main surface is prepared, and in the step of slicing the nitride semiconductor substrate, variation in an off-angle that is formed by a <0001> axis with respect to a normal of a main surface of the nitride semiconductor substrate is made smaller than variation in an off-angle that is formed by the <0001> axis with respect to a normal of the main surface of the base substrate.

10. The method for manufacturing a nitride semiconductor substrate according to claim 1, wherein, in the step of slicing the nitride semiconductor substrate, the nitride semiconductor substrate including no region that has a dislocation density higher than $3 \times 10^6$ cm$^{-2}$, when a dislocation density is determined from a dark spot density by observing a main surface of the nitride semiconductor substrate using a multiphoton excitation microscope in a field of view of 250 µm square, is obtained.

11. The method for manufacturing a nitride semiconductor substrate according to claim 1, wherein, in the step of slicing the nitride semiconductor substrate, the nitride semiconductor substrate having a radius of curvature of a (0001) plane of 23 m or more, is obtained.

* * * * *